United States Patent
Yunusov et al.

(10) Patent No.: US 12,166,575 B2
(45) Date of Patent: Dec. 10, 2024

(54) MULTIPLE INCREMENTAL REDUNDANCY SCHEME USING LINEAR RATELESS CODES

(71) Applicant: QUALCOMM Incorporated, San Diego, CA (US)

(72) Inventors: David Yunusov, Holon (IL); Gideon Shlomo Kutz, Ramat Hasharon (IL)

(73) Assignee: QUALCOMM Incorporated, San Diego, CA (US)

( * ) Notice: Subject to any disclaimer, the term of this patent is extended or adjusted under 35 U.S.C. 154(b) by 44 days.

(21) Appl. No.: 17/863,283

(22) Filed: Jul. 12, 2022

(65) Prior Publication Data

US 2024/0022350 A1    Jan. 18, 2024

(51) Int. Cl.
*H04L 1/00*      (2006.01)
*H03M 13/00*    (2006.01)
*H03M 13/11*    (2006.01)

(52) U.S. Cl.
CPC ....... *H04L 1/0057* (2013.01); *H03M 13/1105* (2013.01); *H03M 13/1174* (2013.01); *H04L 1/0041* (2013.01); *H04L 1/0045* (2013.01)

(58) Field of Classification Search
CPC ... H04L 1/0057; H04L 1/0041; H04L 1/0045; H03M 13/1105; H03M 13/1174
See application file for complete search history.

(56) References Cited

U.S. PATENT DOCUMENTS

| 7,668,125 B2 * | 2/2010 | Kadous | H04L 1/1819 370/465 |
|---|---|---|---|
| 10,116,332 B2 * | 10/2018 | Noh | H04L 1/1819 |
| 2023/0208555 A1 * | 6/2023 | Montorsi | H03M 13/6306 714/726 |
| 2023/0261812 A1 * | 8/2023 | Raphaël | H04L 1/0009 370/329 |
| 2024/0063941 A1 * | 2/2024 | Kim | H03M 13/1102 |

* cited by examiner

*Primary Examiner* — Justin R Knapp
(74) *Attorney, Agent, or Firm* — Holland & Hart LLP

(57) ABSTRACT

Methods, systems, and devices for wireless communications are described. In some examples, a first device may combine, for each of a set of sub-blocks of a block of data, a set of unencoded bits associated with a respective sub-block with a matrix to generate a set of encoded bits. The first device may transmit a first message including the block to a second device. The second device may determine respective probabilities of successful decoding of respective selected candidate codewords for the set of sub-blocks of the block based on receiving the first message and may transmit one or more indicators associated with one or more sub-blocks based on the respective probabilities of successful decoding of the respective selected candidate codewords. The first device may transmit a second message including redundancy information for the one or more sub-blocks based on transmitting the one or more indicators.

30 Claims, 13 Drawing Sheets

MULTIPLE INCREMENTAL REDUNDANCY SCHEME USING LINEAR RATELESS CODES

FIELD OF TECHNOLOGY

The following relates to wireless communications, including a multiple incremental redundancy scheme using linear rateless codes.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations, each supporting wireless communication for communication devices, which may be known as user equipment (UE).

SUMMARY

The described techniques relate to improved methods, systems, devices, and apparatuses that support a multiple incremental redundancy scheme using linear rateless codes. For example, the described techniques provide for implementing a multiple incremental redundancy scheme (MIRS) using a linear rateless code. In some examples, a decoding device may receive a first message including a block, where the block includes a set of sub-blocks. The decoding device may determine respective probabilities of successful decoding of the respective selected candidate codewords for the set of sub-blocks of the block based on receiving the first message and may transmit one or more indicators associated with one or more sub-blocks of the block based on the respective probabilities of successful decoding of the respective selected candidate codewords. The decoding device may receive a second message including redundancy information for the one or more sub-blocks based on transmitting the one or more indicators associated with the one or more sub-blocks.

Additionally or alternatively, an encoding device may combine, for each of a set of sub-blocks of a block of data, a set of unencoded bits associated with a respective sub-block with a matrix to generate a set of encoded bits, wherein the matrix comprises a first set of columns associated with an identity matrix and a second set of columns associated with a parity matrix, where the second set of columns are arranged in an order, and where each column of the second set of columns maximizes Hamming distance over each previous column in the order. The encoding device may transmit a first message including the block and may receive one or more indicators associated with one or more sub-blocks of the block. The encoding device may transmit a second message including redundancy information for the one or more sub-blocks based on receiving the one or more indicators associated with the one or more sub-blocks.

A method for wireless communication is described. The method may include receiving a first message including a block, the block including a set of multiple sub-blocks, determine respective probabilities of successful decoding of respective selected candidate codewords for the set of multiple sub-blocks of the block based on receiving the first message, transmitting one or more indicators associated with one or more sub-blocks of the block based on the respective probabilities of successful decoding of the respective selected candidate codewords, and receiving a second message including redundancy information for the one or more sub-blocks based on transmitting the one or more indicators associated with the one or more sub-blocks.

An apparatus for wireless communication is described. The apparatus may include a processor, memory coupled with the processor, and instructions stored in the memory. The instructions may be executable by the processor to cause the apparatus to receive a first message including a block, the block including a set of multiple sub-blocks, determine respective probabilities of successful decoding of respective selected candidate codewords for the set of multiple sub-blocks of the block based on receiving the first message, transmit one or more indicators associated with one or more sub-blocks of the block based on the respective probabilities of successful decoding of the respective selected candidate codewords, and receive a second message including redundancy information for the one or more sub-blocks based on transmitting the one or more indicators associated with the one or more sub-blocks.

Another apparatus for wireless communication is described. The apparatus may include means for receiving a first message including a block, the block including a set of multiple sub-blocks, means for determine respective probabilities of successful decoding of respective selected candidate codewords for the set of multiple sub-blocks of the block based on receiving the first message, means for transmitting one or more indicators associated with one or more sub-blocks of the block based on the respective probabilities of successful decoding of the respective selected candidate codewords, and means for receiving a second message including redundancy information for the one or more sub-blocks based on transmitting the one or more indicators associated with the one or more sub-blocks.

A non-transitory computer-readable medium storing code for wireless communication is described. The code may include instructions executable by a processor to receive a first message including a block, the block including a set of multiple sub-blocks, determine respective probabilities of successful decoding of respective selected candidate codewords for the set of multiple sub-blocks of the block based on receiving the first message, transmit one or more indicators associated with one or more sub-blocks of the block based on the respective probabilities of successful decoding of the respective selected candidate codewords, and receive a second message including redundancy information for the one or more sub-blocks based on transmitting the one or more indicators associated with the one or more sub-blocks.

Some examples of the method, apparatuses, and non-transitory computer-readable medium described herein may further include operations, features, means, or instructions for receiving an indication of a number of sub-blocks in the one or more sub-blocks, where transmitting the one or more indicators associated with the one or more sub-blocks may be based on the indication of the number of sub-blocks.

Some examples of the method, apparatuses, and non-transitory computer-readable medium described herein may further include operations, features, means, or instructions for receiving an indication of an amount of redundancy information to be indicated in the second message for each of the one or more sub-blocks, where transmitting the one or more indicators associated with the one or more sub-blocks of the set of multiple sub-blocks may be based on receiving the indication of the amount of redundancy information.

Some examples of the method, apparatuses, and non-transitory computer-readable medium described herein may further include operations, features, means, or instructions for determining, for each sub-block of the set of multiple sub-blocks and for each candidate codeword of a set of candidate codewords, a correlation of the respective candidate codeword against a logarithmic likelihood ratio associated with the respective sub-block and selecting the respective selected candidate codewords for the set of multiple sub-blocks based on determining the correlation for each sub-block of the set of multiple sub-blocks and for each candidate codeword of the set of candidate codewords.

In some examples of the method, apparatuses, and non-transitory computer-readable medium described herein, the respective set of candidate codewords for each sub-block of the set of multiple sub-blocks includes each possible candidate codeword that may have a length equal to that of the respective sub-block.

In some examples of the method, apparatuses, and non-transitory computer-readable medium described herein, the respective probability of successful decoding for each respective selected candidate codeword includes a ratio of the correlation for the respective selected candidate codeword to a sum of correlations among one or more candidate codewords of the respective set of candidate codewords associated with the sub-block that the respective selected candidate codeword corresponds to and the correlation of the respective selected candidate codeword may have a highest value among the respective set of candidate codewords associated with the sub-block that the respective selected candidate codeword corresponds to.

Some examples of the method, apparatuses, and non-transitory computer-readable medium described herein may further include operations, features, means, or instructions for decoding a set of predecoded codewords to generate the respective selected candidate codewords, where determining the respective probabilities of successful decoding of respective selected candidate codewords may be based on a first set of logarithmic likelihood ratios of bits associated with the respective selected candidate codewords or a second set of logarithmic likelihood ratios of bits associated with the set of predecoded codewords.

In some examples of the method, apparatuses, and non-transitory computer-readable medium described herein, the redundancy information includes a respective set of parity bits for each of the one or more sub-blocks.

In some examples of the method, apparatuses, and non-transitory computer-readable medium described herein, a total number of parity bits associated with a first sub-block of the one or more sub-blocks after receiving the second message may be greater than a total number of parity bits associated with a second sub-block of the set of multiple sub-blocks that may be excluded from the one or more sub-blocks.

In some examples of the method, apparatuses, and non-transitory computer-readable medium described herein, a total number of parity bits associated with the first sub-block of the one or more sub-blocks after receiving the second message may be greater than a total number of parity bits associated with a second sub-block of the one or more sub-blocks.

In some examples of the method, apparatuses, and non-transitory computer-readable medium described herein, the respective set of parity bits for each of the one or more sub-blocks may be associated with a same number of parity bits.

In some examples of the method, apparatuses, and non-transitory computer-readable medium described herein, the first message includes a check code corresponding to the block and determining the respective probabilities of successful decoding of the respective selected candidate codewords may be based on determining a failure of a comparison of the check code for the block with a check value generated from the respective selected candidate codewords.

In some examples of the method, apparatuses, and non-transitory computer-readable medium described herein, the first message includes a set of check codes and each check code of the set of check codes corresponds to a respective sub-block of the set of multiple sub-blocks.

Some examples of the method, apparatuses, and non-transitory computer-readable medium described herein may further include operations, features, means, or instructions for determining the respective probabilities of successful decoding of the respective selected candidate codewords may be based on determining a failure of one or more check codes of the set of check codes with a check value generated from one or more of the respective selected candidate codewords.

A method for wireless communication is described. The method may include combining, for each of a set of multiple sub-blocks of a block of data, a set of unencoded bits associated with a respective sub-block with a matrix to generate a set of encoded bits, where the matrix includes a first set of columns associated with an identity matrix and a second set of columns associated with a parity matrix, where the second set of columns are arranged in an order, and where each column of the second set of columns maximizes hamming distance over each previous column in the order, transmitting a first message including the block, receiving one or more indicators associated with one or more sub-blocks of the block, and transmitting a second message including redundancy information for the one or more sub-blocks based on receiving the one or more indicators associated with the one or more sub-blocks.

An apparatus for wireless communication is described. The apparatus may include a processor, memory coupled with the processor, and instructions stored in the memory. The instructions may be executable by the processor to cause the apparatus to combine, for each of a set of multiple sub-blocks of a block of data, a set of unencoded bits associated with a respective sub-block with a matrix to generate a set of encoded bits, where the matrix includes a first set of columns associated with an identity matrix and a second set of columns associated with a parity matrix, where the second set of columns are arranged in an order, and where each column of the second set of columns maximizes hamming distance over each previous column in the order, transmit a first message including the block, receive one or more indicators associated with one or more sub-blocks of the block, and transmit a second message including redundancy information for the one or more sub-blocks based on receiving the one or more indicators associated with the one or more sub-blocks.

Another apparatus for wireless communication is described. The apparatus may include means for combining, for each of a set of multiple sub-blocks of a block of data, a set of unencoded bits associated with a respective sub-block with a matrix to generate a set of encoded bits, where the matrix includes a first set of columns associated with an identity matrix and a second set of columns associated with a parity matrix, where the second set of columns are arranged in an order, and where each column of the second set of columns maximizes hamming distance over each previous column in the order, means for transmitting a first message including the block, means for receiving one or more indicators associated with one or more sub-blocks of the block, and means for transmitting a second message including redundancy information for the one or more sub-blocks based on receiving the one or more indicators associated with the one or more sub-blocks.

A non-transitory computer-readable medium storing code for wireless communication is described. The code may include instructions executable by a processor to combine, for each of a set of multiple sub-blocks of a block of data, a set of unencoded bits associated with a respective sub-block with a matrix to generate a set of encoded bits, where the matrix includes a first set of columns associated with an identity matrix and a second set of columns associated with a parity matrix, where the second set of columns are arranged in an order, and where each column of the second set of columns maximizes hamming distance over each previous column in the order, transmit a first message including the block, receive one or more indicators associated with one or more sub-blocks of the block, and transmit a second message including redundancy information for the one or more sub-blocks based on receiving the one or more indicators associated with the one or more sub-blocks.

Some examples of the method, apparatuses, and non-transitory computer-readable medium described herein may further include operations, features, means, or instructions for transmitting an indication of a number of sub-blocks in the one or more sub-blocks, where receiving the one or more indicators associated with the one or more sub-blocks may be based on the indication of the number of sub-blocks.

Some examples of the method, apparatuses, and non-transitory computer-readable medium described herein may further include operations, features, means, or instructions for transmitting an indication of an amount of redundancy information to be indicated in the second message for each of the one or more sub-blocks, where receiving the one or more indicators associated with the one or more sub-blocks of the set of multiple sub-blocks may be based on transmitting the indication of the amount of redundancy information.

Some examples of the method, apparatuses, and non-transitory computer-readable medium described herein may further include operations, features, means, or instructions for puncturing an ordered list of symbols, where the puncturing includes, identifying a next symbol for transmission on the ordered list, replacing the next symbol with another symbol on the ordered list based on receiving the one or more indicators associated with the one or more sub-blocks of the block, and transmitting the other symbol based on the replacing.

In some examples of the method, apparatuses, and non-transitory computer-readable medium described herein, the order for the second set of columns corresponds to a second order that may be rearranged from a first order of a linear block code.

In some examples of the method, apparatuses, and non-transitory computer-readable medium described herein, the redundancy information includes a respective set of parity bits for each of the one or more sub-blocks.

In some examples of the method, apparatuses, and non-transitory computer-readable medium described herein, the first message includes a check code for the block.

DETAILED DESCRIPTION

Figure 1:
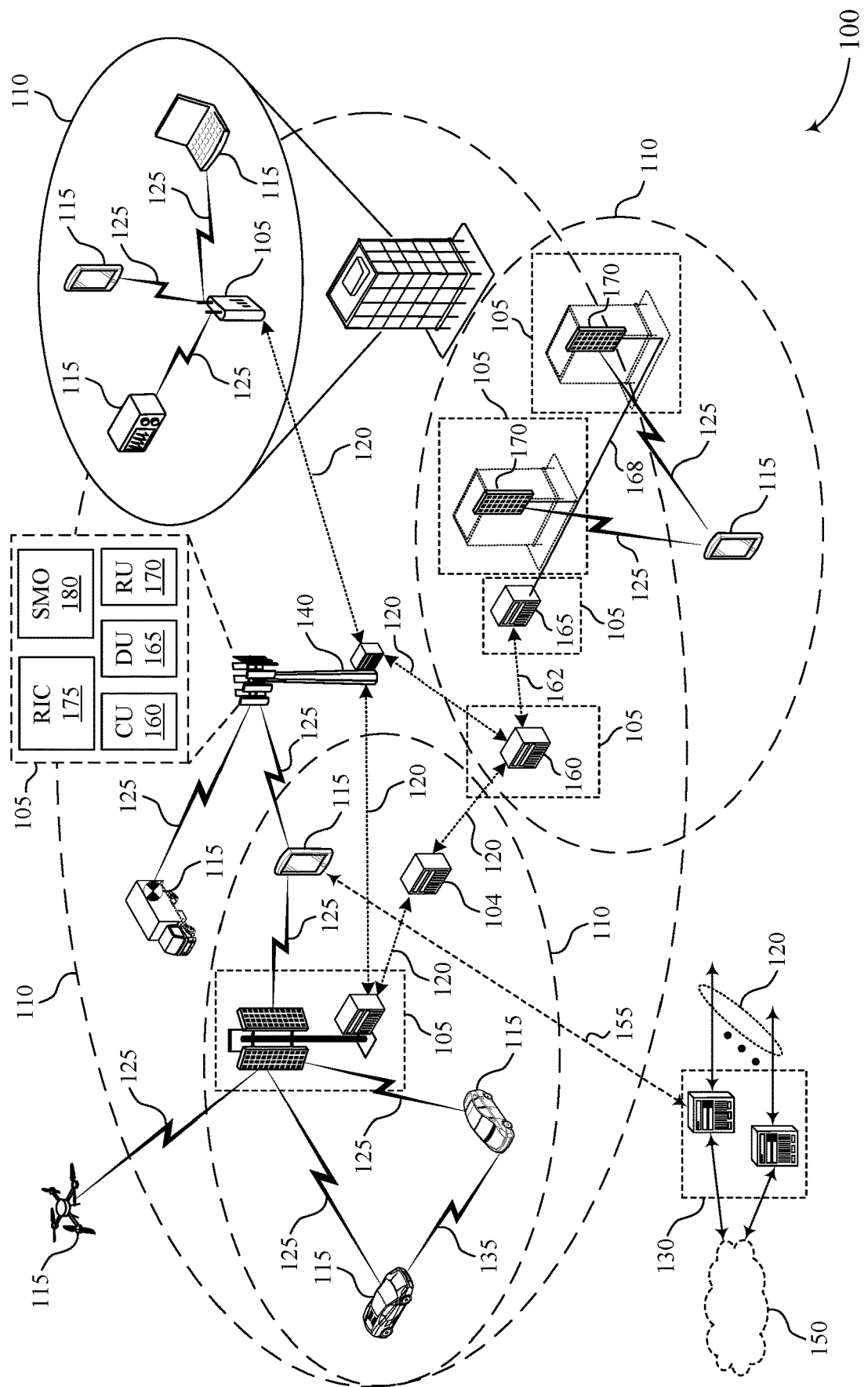
FIG. 1 illustrates an example of a wireless communications system that supports a multiple incremental redundancy scheme using linear rateless codes in accordance with one or more aspects of the present disclosure.

In some examples, a first device may provide channel state information (CSI) to a second device that includes feedback related to a channel between the first device and the second device. The second device may then encode a message using a level of redundancy (e.g., based on a coding scheme) that corresponds to an acceptable block error rate (BLER) for the message. An automatic repeat request (ARQ) scheme such as hybrid-ARQ (HARQ) may be used to transmit additional redundancy information when the first device fails to successfully decode a message. However, continuously using a level of redundancy that achieves a desired BLER may result in unnecessary redundancy information included for some messages (e.g., where the message could have been decoded with less redundancy information).

In order to reduce the amount of unnecessary redundancy information, the second device may implement a multiple incremental redundancy scheme (MIRS). For instance, the second device may initially transmit a transmission with no or a reduced amount of redundancy. If the first device indicates to the second device that it has failed to receive at least a portion of the transmission, the second device may transmit a retransmission with redundancy information for the previous retransmission. The second device may continue to send additional redundancy information in each following retransmission of the transmission until the first device successfully decodes the message in the transmission.

The present disclosure may describe methods for implementing MIRS using a linear rateless code. For instance, the second device may split a transmission, which may include a block of data, into a set of sub-blocks and may apply a matrix to each sub-block of the set of sub-blocks in order to generate the encoded bits. The encoded bits for each sub-block may, for instance, include a first portion that is the same as the bits of the respective sub-block and a second portion that includes redundancy information. After performing the encoding, the second device may transmit at least a portion of the encoded bits for each sub-block. For instance, for an initial transmission, the second device may transmit the first portion of the encoded bits for each sub-block (e.g., the second device may not transmit redundancy information initially). The first device may determine whether it has successfully received and decoded each sub-block and may provide an indication of one or more sub-blocks that the first device has failed to receive. The second device may receive the indication of the one or more sub-blocks and may transmit additional redundancy information (e.g., bits from the second portion) for the indicated one or more sub-blocks such that the overall amount of redundancy increases. By including additional redundancy information for the indicated one or more sub-blocks, the second wireless device may increase the likelihood that the first wireless device successfully decodes the one or more sub-blocks. Additionally, in examples in which the second wireless device refrains from including additional redundancy information for the other sub-blocks of the set that are excluded from the one or more sub-blocks, the transmissions for the block of data may have decreased overhead relative to transmissions in which the amount of redundancy information is set at a same level for each sub-block.

Aspects of the disclosure are initially described in the context of wireless communications systems. Additional aspects of the disclosure are described in the context of an encoding scheme and Aspects of the disclosure are further illustrated by and described with reference to apparatus diagrams, system diagrams, and flowcharts that relate to a multiple incremental redundancy scheme using linear rateless codes.

FIG. 1 illustrates an example of a wireless communications system 100 that supports a multiple incremental redundancy scheme using linear rateless codes in accordance with one or more aspects of the present disclosure. The wireless communications system 100 may include one or more network entities 105, one or more UEs 115, and a core network 130. In some examples, the wireless communications system 100 may be a Long Term Evolution (LTE) network, an LTE-Advanced (LTE-A) network, an LTE-A Pro network, a New Radio (NR) network, or a network operating in accordance with other systems and radio technologies, including future systems and radio technologies not explicitly mentioned herein.

The network entities 105 may be dispersed throughout a geographic area to form the wireless communications system 100 and may include devices in different forms or having different capabilities. In various examples, a network entity 105 may be referred to as a network element, a mobility element, a radio access network (RAN) node, or network equipment, among other nomenclature. In some examples, network entities 105 and UEs 115 may wirelessly communicate via one or more communication links 125 (e.g., a radio frequency (RF) access link). For example, a network entity 105 may support a coverage area 110 (e.g., a geographic coverage area) over which the UEs 115 and the network entity 105 may establish one or more communication links 125. The coverage area 110 may be an example of a geographic area over which a network entity 105 and a UE 115 may support the communication of signals according to one or more radio access technologies (RATs).

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115 or network entities 105, as shown in FIG. 1.

As described herein, a node of the wireless communications system 100, which may be referred to as a network node, or a wireless node, may be a network entity 105 (e.g., any network entity described herein), a UE 115 (e.g., any UE described herein), a network controller, an apparatus, a device, a computing system, one or more components, or another suitable processing entity configured to perform any of the techniques described herein. For example, a node may be a UE 115. As another example, a node may be a network entity 105. As another example, a first node may be configured to communicate with a second node or a third node. In one aspect of this example, the first node may be a UE 115, the second node may be a network entity 105, and the third node may be a UE 115. In another aspect of this example, the first node may be a UE 115, the second node may be a network entity 105, and the third node may be a network entity 105. In yet other aspects of this example, the first, second, and third nodes may be different relative to these examples. Similarly, reference to a UE 115, network entity 105, apparatus, device, computing system, or the like may include disclosure of the UE 115, network entity 105, apparatus, device, computing system, or the like being a node. For example, disclosure that a UE 115 is configured to receive information from a network entity 105 also discloses that a first node is configured to receive information from a second node.

In some examples, network entities 105 may communicate with the core network 130, or with one another, or both. For example, network entities 105 may communicate with the core network 130 via one or more backhaul communication links 120 (e.g., in accordance with an S1, N2, N3, or other interface protocol). In some examples, network entities 105 may communicate with one another over a backhaul communication link 120 (e.g., in accordance with an X2, Xn, or other interface protocol) either directly (e.g., directly between network entities 105) or indirectly (e.g., via a core network 130). In some examples, network entities 105 may communicate with one another via a midhaul communication link 162 (e.g., in accordance with a midhaul interface protocol) or a fronthaul communication link 168 (e.g., in accordance with a fronthaul interface protocol), or any combination thereof. The backhaul communication links 120, midhaul communication links 162, or fronthaul communication links 168 may be or include one or more wired links (e.g., an electrical link, an optical fiber link), one or more wireless links (e.g., a radio link, a wireless optical link), among other examples or various combinations thereof. A UE 115 may communicate with the core network 130 through a communication link 155.

One or more of the network entities 105 described herein may include or may be referred to as a base station 140 (e.g., a base transceiver station, a radio base station, an NR base station, an access point, a radio transceiver, a NodeB, an eNodeB (eNB), a next-generation NodeB or a giga-NodeB (either of which may be referred to as a gNB), a 5G NB, a next-generation eNB (ng-eNB), a Home NodeB, a Home eNodeB, or other suitable terminology). In some examples, a network entity 105 (e.g., a base station 140) may be implemented in an aggregated (e.g., monolithic, standalone) base station architecture, which may be configured to utilize a protocol stack that is physically or logically integrated within a single network entity 105 (e.g., a single RAN node, such as a base station 140).

In some examples, a network entity 105 may be implemented in a disaggregated architecture (e.g., a disaggregated base station architecture, a disaggregated RAN architecture), which may be configured to utilize a protocol stack that is physically or logically distributed among two or more network entities 105, such as an integrated access backhaul (IAB) network, an open RAN (O-RAN) (e.g., a network configuration sponsored by the O-RAN Alliance), or a virtualized RAN (vRAN) (e.g., a cloud RAN (C-RAN)). For example, a network entity 105 may include one or more of a central unit (CU) 160, a distributed unit (DU) 165, a radio unit (RU) 170, a RAN Intelligent Controller (RIC) 175 (e.g., a Near-Real Time RIC (Near-RT RIC), a Non-Real Time RIC (Non-RT RIC)), a Service Management and Orchestration (SMO) 180 system, or any combination thereof. An RU 170 may also be referred to as a radio head, a smart radio head, a remote radio head (RRH), a remote radio unit (RRU), or a transmission reception point (TRP). One or more components of the network entities 105 in a disaggregated RAN architecture may be co-located, or one or more components of the network entities 105 may be located in distributed locations (e.g., separate physical locations). In some examples, one or more network entities 105 of a disaggregated RAN architecture may be implemented as virtual units (e.g., a virtual CU (VCU), a virtual DU (VDU), a virtual RU (VRU)).

The split of functionality between a CU 160, a DU 165, and an RU 170 is flexible and may support different functionalities depending upon which functions (e.g., network layer functions, protocol layer functions, baseband functions, RF functions, and any combinations thereof) are performed at a CU 160, a DU 165, or an RU 170. For example, a functional split of a protocol stack may be employed between a CU 160 and a DU 165 such that the CU 160 may support one or more layers of the protocol stack and the DU 165 may support one or more different layers of the protocol stack. In some examples, the CU 160 may host upper protocol layer (e.g., layer 3 (L3), layer 2 (L2)) functionality and signaling (e.g., Radio Resource Control (RRC), service data adaption protocol (SDAP), Packet Data Convergence Protocol (PDCP)). The CU 160 may be connected to one or more DUs 165 or RUs 170, and the one or more DUs 165 or RUs 170 may host lower protocol layers, such as layer 1 (L1) (e.g., physical (PHY) layer) or L2 (e.g., radio link control (RLC) layer, medium access control (MAC) layer) functionality and signaling, and may each be at least partially controlled by the CU 160. Additionally, or alternatively, a functional split of the protocol stack may be employed between a DU 165 and an RU 170 such that the DU 165 may support one or more layers of the protocol stack and the RU 170 may support one or more different layers of the protocol stack. The DU 165 may support one or multiple different cells (e.g., via one or more RUs 170). In some cases, a functional split between a CU 160 and a DU 165, or between a DU 165 and an RU 170 may be within a protocol layer (e.g., some functions for a protocol layer may be performed by one of a CU 160, a DU 165, or an RU 170, while other functions of the protocol layer are performed by a different one of the CU 160, the DU 165, or the RU 170). A CU 160 may be functionally split further into CU control plane (CU-CP) and CU user plane (CU-UP) functions. A CU 160 may be connected to one or more DUs 165 via a midhaul communication link 162 (e.g., F1, F1-c, F1-u), and a DU 165 may be connected to one or more RUs 170 via a fronthaul communication link 168 (e.g., open fronthaul (FH) interface). In some examples, a midhaul communication link 162 or a fronthaul communication link 168 may be implemented in accordance with an interface (e.g., a channel) between layers of a protocol stack supported by respective network entities 105 that are in communication over such communication links.

In wireless communications systems (e.g., wireless communications system 100), infrastructure and spectral resources for radio access may support wireless backhaul link capabilities to supplement wired backhaul connections, providing an IAB network architecture (e.g., to a core network 130). In some cases, in an IAB network, one or more network entities 105 (e.g., IAB nodes 104) may be partially controlled by each other. One or more IAB nodes 104 may be referred to as a donor entity or an IAB donor. One or more DUs 165 or one or more RUs 170 may be partially controlled by one or more CUs 160 associated with a donor network entity 105 (e.g., a donor base station 140). The one or more donor network entities 105 (e.g., IAB donors) may be in communication with one or more additional network entities 105 (e.g., IAB nodes 104) via supported access and backhaul links (e.g., backhaul communication links 120). IAB nodes 104 may include an IAB mobile termination (IAB-MT) controlled (e.g., scheduled) by DUs 165 of a coupled IAB donor. An IAB-MT may include an independent set of antennas for relay of communications with UEs 115, or may share the same antennas (e.g., of an RU 170) of an IAB node 104 used for access via the DU 165 of the IAB node 104 (e.g., referred to as virtual IAB-MT (vIAB-MT)). In some examples, the IAB nodes 104 may include DUs 165 that support communication links with additional entities (e.g., IAB nodes 104, UEs 115) within the relay chain or configuration of the access network (e.g., downstream). In such cases, one or more components of the disaggregated RAN architecture (e.g., one or more IAB nodes 104 or components of IAB nodes 104) may be configured to operate according to the techniques described herein.

For instance, an access network (AN) or RAN may include communications between access nodes (e.g., an IAB donor), IAB nodes 104, and one or more UEs 115. The IAB donor may facilitate connection between the core network 130 and the AN (e.g., via a wired or wireless connection to the core network 130). That is, an IAB donor may refer to a RAN node with a wired or wireless connection to core network 130. The IAB donor may include a CU 160 and at least one DU 165 (e.g., and RU 170), in which case the CU 160 may communicate with the core network 130 over an interface (e.g., a backhaul link). IAB donor and IAB nodes 104 may communicate over an F1 interface according to a protocol that defines signaling messages (e.g., an F1 AP protocol). Additionally, or alternatively, the CU 160 may communicate with the core network over an interface, which may be an example of a portion of backhaul link, and may communicate with other CUs 160 (e.g., a CU 160 associated with an alternative IAB donor) over an Xn-C interface, which may be an example of a portion of a backhaul link.

An IAB node 104 may refer to a RAN node that provides IAB functionality (e.g., access for UEs 115, wireless self-backhauling capabilities). A DU 165 may act as a distributed scheduling node towards child nodes associated with the IAB node 104, and the IAB-MT may act as a scheduled node towards parent nodes associated with the IAB node 104. That is, an IAB donor may be referred to as a parent node in communication with one or more child nodes (e.g., an IAB donor may relay transmissions for UEs through one or more other IAB nodes 104). Additionally, or alternatively, an IAB node 104 may also be referred to as a parent node or a child node to other IAB nodes 104, depending on the relay chain or configuration of the AN. Therefore, the IAB-MT entity of IAB nodes 104 may provide a Uu interface for a child IAB node 104 to receive signaling from a parent IAB node 104, and the DU interface (e.g., DUs 165) may provide a Uu interface for a parent IAB node 104 to signal to a child IAB node 104 or UE 115.

For example, IAB node 104 may be referred to as a parent node that supports communications for a child IAB node, and referred to as a child IAB node associated with an IAB donor. The IAB donor may include a CU 160 with a wired or wireless connection (e.g., a backhaul communication link 120) to the core network 130 and may act as parent node to IAB nodes 104. For example, the DU 165 of IAB donor may relay transmissions to UEs 115 through IAB nodes 104, and may directly signal transmissions to a UE 115. The CU 160 of IAB donor may signal communication link establishment via an F1 interface to IAB nodes 104, and the IAB nodes 104 may schedule transmissions (e.g., transmissions to the UEs 115 relayed from the IAB donor) through the DUs 165. That is, data may be relayed to and from IAB nodes 104 via signaling over an NR Uu interface to MT of the IAB node 104. Communications with IAB node 104 may be scheduled by a DU 165 of IAB donor and communications with IAB node 104 may be scheduled by DU 165 of IAB node 104.

In the case of the techniques described herein applied in the context of a disaggregated RAN architecture, one or more components of the disaggregated RAN architecture may be configured to support linear rateless codes as described herein. For example, some operations described as being performed by a UE 115 or a network entity 105 (e.g., a base station 140) may additionally, or alternatively, be performed by one or more components of the disaggregated RAN architecture (e.g., IAB nodes 104, DUs 165, CUs 160, RUs 170, RIC 175, SMO 180).

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the network entities 105 and the network equipment including macro eNBs or gNBs, small cell eNBs or gNBs, or relay base stations, among other examples, as shown in FIG. 1.

The UEs 115 and the network entities 105 may wirelessly communicate with one another via one or more communication links 125 (e.g., an access link) over one or more carriers. The term "carrier" may refer to a set of RF spectrum resources having a defined physical layer structure for supporting the communication links 125. For example, a carrier used for a communication link 125 may include a portion of a RF spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers. Communication between a network entity 105 and other devices may refer to communication between the devices and any portion (e.g., entity, sub-entity) of a network entity 105. For example, the terms "transmitting," "receiving," or "communicating," when referring to a network entity 105, may refer to any portion of a network entity 105 (e.g., a base station 140, a CU 160, a DU 165, a RU 170) of a RAN communicating with another device (e.g., directly or via one or more other network entities 105).

In some examples, such as in a carrier aggregation configuration, a carrier may also have acquisition signaling or control signaling that coordinates operations for other carriers. A carrier may be associated with a frequency channel (e.g., an evolved universal mobile telecommunication system terrestrial radio access (E-UTRA) absolute RF channel number (EARFCN)) and may be positioned according to a channel raster for discovery by the UEs 115. A carrier may be operated in a standalone mode, in which case initial acquisition and connection may be conducted by the UEs 115 via the carrier, or the carrier may be operated in a non-standalone mode, in which case a connection is anchored using a different carrier (e.g., of the same or a different radio access technology).

The communication links 125 shown in the wireless communications system 100 may include downlink transmissions (e.g., forward link transmissions) from a network entity 105 to a UE 115, uplink transmissions (e.g., return link transmissions) from a UE 115 to a network entity 105, or both, among other configurations of transmissions. Carriers may carry downlink or uplink communications (e.g., in an FDD mode) or may be configured to carry downlink and uplink communications (e.g., in a TDD mode).

A carrier may be associated with a particular bandwidth of the RF spectrum and, in some examples, the carrier bandwidth may be referred to as a "system bandwidth" of the carrier or the wireless communications system 100. For example, the carrier bandwidth may be one of a set of bandwidths for carriers of a particular radio access technology (e.g., 1.4, 3, 5, 10, 15, 20, 40, or 80 megahertz (MHz)). Devices of the wireless communications system 100 (e.g., the network entities 105, the UEs 115, or both) may have hardware configurations that support communications over a particular carrier bandwidth or may be configurable to support communications over one of a set of carrier bandwidths. In some examples, the wireless communications system 100 may include network entities 105 or UEs 115 that support concurrent communications via carriers associated with multiple carrier bandwidths. In some examples, each served UE 115 may be configured for operating over portions (e.g., a sub-band, a BWP) or all of a carrier bandwidth.

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may refer to resources of one symbol period (e.g., a duration of one modulation symbol) and one subcarrier, in which case the symbol period and subcarrier spacing may be inversely related. The quantity of bits carried by each resource element may depend on the modulation scheme (e.g., the order of the modulation scheme, the coding rate of the modulation scheme, or both) such that the more resource elements that a device receives and the higher the order of the modulation scheme, the higher the data rate may be for the device. A wireless communications resource may refer to a combination of an RF spectrum resource, a time resource, and a spatial resource (e.g., a spatial layer, a beam), and the use of multiple spatial resources may increase the data rate or data integrity for communications with a UE 115.

One or more numerologies for a carrier may be supported, where a numerology may include a subcarrier spacing ($\Delta f$) and a cyclic prefix. A carrier may be divided into one or more BWPs having the same or different numerologies. In some examples, a UE 115 may be configured with multiple BWPs. In some examples, a single BWP for a carrier may be active at a given time and communications for the UE 115 may be restricted to one or more active BWPs.

The time intervals for the network entities 105 or the UEs 115 may be expressed in multiples of a basic time unit which may, for example, refer to a sampling period of $T_s=1/(\Delta f_{max} \cdot N_f)$ seconds, where $\Delta f_{max}$ may represent the maximum supported subcarrier spacing, and N f may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a quantity of slots. Alternatively, each frame may include a variable quantity of slots, and the quantity of slots may depend on subcarrier spacing. Each slot may include a quantity of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., a quantity of symbol periods in a TTI) may be variable. Additionally, or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a set of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to an amount of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

A network entity 105 may provide communication coverage via one or more cells, for example a macro cell, a small cell, a hot spot, or other types of cells, or any combination thereof. The term "cell" may refer to a logical communication entity used for communication with a network entity 105 (e.g., over a carrier) and may be associated with an identifier for distinguishing neighboring cells (e.g., a physical cell identifier (PCID), a virtual cell identifier (VCID), or others). In some examples, a cell may also refer to a coverage area 110 or a portion of a coverage area 110 (e.g., a sector) over which the logical communication entity operates. Such cells may range from smaller areas (e.g., a structure, a subset of structure) to larger areas depending on various factors such as the capabilities of the network entity 105. For example, a cell may be or include a building, a subset of a building, or exterior spaces between or overlapping with coverage areas 110, among other examples.

A macro cell generally covers a relatively large geographic area (e.g., several kilometers in radius) and may allow unrestricted access by the UEs 115 with service subscriptions with the network provider supporting the macro cell. A small cell may be associated with a lower-powered network entity 105 (e.g., a lower-powered base station 140), as compared with a macro cell, and a small cell may operate in the same or different (e.g., licensed, unlicensed) frequency bands as macro cells. Small cells may provide unrestricted access to the UEs 115 with service subscriptions with the network provider or may provide restricted access to the UEs 115 having an association with the small cell (e.g., the UEs 115 in a closed subscriber group (CSG), the UEs 115 associated with users in a home or office). A network entity 105 may support one or multiple cells and may also support communications over the one or more cells using one or multiple component carriers.

In some examples, a carrier may support multiple cells, and different cells may be configured according to different protocol types (e.g., MTC, narrowband IoT (NB-IoT), enhanced mobile broadband (eMBB)) that may provide access for different types of devices.

In some examples, a network entity 105 (e.g., a base station 140, an RU 170) may be movable and therefore provide communication coverage for a moving coverage area 110. In some examples, different coverage areas 110 associated with different technologies may overlap, but the different coverage areas 110 may be supported by the same network entity 105. In some other examples, the overlapping coverage areas 110 associated with different technologies may be supported by different network entities 105. The wireless communications system 100 may include, for example, a heterogeneous network in which different types of the network entities 105 provide coverage for various coverage areas 110 using the same or different radio access technologies.

The wireless communications system 100 may support synchronous or asynchronous operation. For synchronous operation, network entities 105 (e.g., base stations 140) may have similar frame timings, and transmissions from different network entities 105 may be approximately aligned in time. For asynchronous operation, network entities 105 may have different frame timings, and transmissions from different network entities 105 may, in some examples, not be aligned in time. The techniques described herein may be used for either synchronous or asynchronous operations.

Some UEs 115, such as MTC or IoT devices, may be low cost or low complexity devices and may provide for automated communication between machines (e.g., via Machine-to-Machine (M2M) communication). M2M communication or MTC may refer to data communication technologies that allow devices to communicate with one another or a network entity 105 (e.g., a base station 140) without human intervention. In some examples, M2M communication or MTC may include communications from devices that integrate sensors or meters to measure or capture information and relay such information to a central server or application program that makes use of the information or presents the information to humans interacting with the application program. Some UEs 115 may be designed to collect information or enable automated behavior of machines or other devices. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception concurrently). In some examples, half-duplex communications may be performed at a reduced peak rate. Other power conservation techniques for the UEs 115 include entering a power saving deep sleep mode when not engaging in active communications, operating over a limited bandwidth (e.g., according to narrowband communications), or a combination of these techniques. For example, some UEs 115 may be configured for operation using a narrowband protocol type that is associated with a defined portion or range (e.g., set of subcarriers or resource blocks (RBs)) within a carrier, within a guard-band of a carrier, or outside of a carrier.

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may be able to communicate directly with other UEs 115 over a device-to-device (D2D) communication link 135 (e.g., in accordance with a peer-to-peer (P2P), D2D, or sidelink protocol). In some examples, one or more UEs 115 of a group that are performing D2D communications may be within the coverage area 110 of a network entity 105 (e.g., a base station 140, an RU 170), which may support aspects of such D2D communications being configured by or scheduled by the network entity 105. In some examples, one or more UEs 115 in such a group may be outside the coverage area 110 of a network entity 105 or may be otherwise unable to or not configured to receive transmissions from a network entity 105. In some examples, groups of the UEs 115 communicating via D2D communications may support a one-to-many (1:M) system in which each UE 115 transmits to each of the other UEs 115 in the group. In some examples, a network entity 105 may facilitate the scheduling of resources for D2D communications. In some other examples, D2D communications may be carried out between the UEs 115 without the involvement of a network entity 105.

In some systems, a D2D communication link 135 may be an example of a communication channel, such as a sidelink communication channel, between vehicles (e.g., UEs 115). In some examples, vehicles may communicate using vehicle-to-everything (V2X) communications, vehicle-to-vehicle (V2V) communications, or some combination of these. A vehicle may signal information related to traffic conditions, signal scheduling, weather, safety, emergencies, or any other information relevant to a V2X system. In some examples, vehicles in a V2X system may communicate with roadside infrastructure, such as roadside units, or with the network via one or more network nodes (e.g., network entities 105, base stations 140, RUs 170) using vehicle-to-network (V2N) communications, or with both.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the network entities 105 (e.g., base stations 140) associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

The wireless communications system 100 may operate using one or more frequency bands, which may be in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, which may be referred to as clusters, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may also operate in a super high frequency (SHF) region using frequency bands from 3 GHz to 30 GHz, also known as the centimeter band, or in an extremely high frequency (EHF) region of the spectrum (e.g., from 30 GHz to 300 GHz), also known as the millimeter band. In some examples, the wireless communications system 100 may support millimeter wave (mmW) communications between the UEs 115 and the network entities 105 (e.g., base stations 140, RUs 170), and EHF antennas of the respective devices may be smaller and more closely spaced than UHF antennas. In some examples, this may facilitate use of antenna arrays within a device. The propagation of EHF transmissions, however, may be subject to even greater atmospheric attenuation and shorter range than SHF or UHF transmissions. The techniques disclosed herein may be employed across transmissions that use one or more different frequency regions, and designated use of bands across these frequency regions may differ by country or regulating body.

The wireless communications system 100 may utilize both licensed and unlicensed RF spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. While operating in unlicensed RF spectrum bands, devices such as the network entities 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A network entity 105 (e.g., a base station 140, an RU 170) or a UE 115 may be equipped with multiple antennas, which may be used to employ techniques such as transmit diversity, receive diversity, multiple-input multiple-output (MIMO) communications, or beamforming. The antennas of a network entity 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a network entity 105 may be located in diverse geographic locations. A network entity 105 may have an antenna array with a set of rows and columns of antenna ports that the network entity 105 may use to support beamforming of communications with a UE 115. Likewise, a UE 115 may have one or more antenna arrays that may support various MIMO or beamforming operations. Additionally, or alternatively, an antenna panel may support RF beamforming for a signal transmitted via an antenna port.

The network entities 105 or the UEs 115 may use MIMO communications to exploit multipath signal propagation and increase the spectral efficiency by transmitting or receiving multiple signals via different spatial layers. Such techniques may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry information associated with the same data stream (e.g., the same codeword) or different data streams (e.g., different codewords). Different spatial layers may be associated with different antenna ports used for channel measurement and reporting. MIMO techniques include single-user MIMO (SU-MIMO), where multiple spatial layers are transmitted to the same receiving device, and multiple-user MIMO (MU-MIMO), where multiple spatial layers are transmitted to multiple devices.

Beamforming, which may also be referred to as spatial filtering, directional transmission, or directional reception, is a signal processing technique that may be used at a transmitting device or a receiving device (e.g., a network entity 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

A network entity 105 or a UE 115 may use beam sweeping techniques as part of beamforming operations. For example, a network entity 105 (e.g., a base station 140, an RU 170) may use multiple antennas or antenna arrays (e.g., antenna panels) to conduct beamforming operations for directional communications with a UE 115. Some signals (e.g., synchronization signals, reference signals, beam selection signals, or other control signals) may be transmitted by a network entity 105 multiple times along different directions. For example, the network entity 105 may transmit a signal according to different beamforming weight sets associated with different directions of transmission. Transmissions along different beam directions may be used to identify (e.g., by a transmitting device, such as a network entity 105, or by a receiving device, such as a UE 115) a beam direction for later transmission or reception by the network entity 105.

Some signals, such as data signals associated with a particular receiving device, may be transmitted by transmitting device (e.g., a transmitting network entity 105, a transmitting UE 115) along a single beam direction (e.g., a direction associated with the receiving device, such as a receiving network entity 105 or a receiving UE 115). In some examples, the beam direction associated with transmissions along a single beam direction may be determined based on a signal that was transmitted along one or more beam directions. For example, a UE 115 may receive one or more of the signals transmitted by the network entity 105 along different directions and may report to the network entity 105 an indication of the signal that the UE 115 received with a highest signal quality or an otherwise acceptable signal quality.

In some examples, transmissions by a device (e.g., by a network entity 105 or a UE 115) may be performed using multiple beam directions, and the device may use a combination of digital precoding or beamforming to generate a combined beam for transmission (e.g., from a network entity 105 to a UE 115). The UE 115 may report feedback that indicates precoding weights for one or more beam directions, and the feedback may correspond to a configured set of beams across a system bandwidth or one or more sub-bands. The network entity 105 may transmit a reference signal (e.g., a cell-specific reference signal (CRS), a channel state information reference signal (CSI-RS)), which may be precoded or unprecoded. The UE 115 may provide feedback for beam selection, which may be a precoding matrix indicator (PMI) or codebook-based feedback (e.g., a multi-panel type codebook, a linear combination type codebook, a port selection type codebook). Although these techniques are described with reference to signals transmitted along one or more directions by a network entity 105 (e.g., a base station 140, an RU 170), a UE 115 may employ similar techniques for transmitting signals multiple times along different directions (e.g., for identifying a beam direction for subsequent transmission or reception by the UE 115) or for transmitting a signal along a single direction (e.g., for transmitting data to a receiving device).

A receiving device (e.g., a UE 115) may perform reception operations in accordance with multiple receive configurations (e.g., directional listening) when receiving various signals from a receiving device (e.g., a network entity 105), such as synchronization signals, reference signals, beam selection signals, or other control signals. For example, a receiving device may perform reception in accordance with multiple receive directions by receiving via different antenna subarrays, by processing received signals according to different antenna subarrays, by receiving according to different receive beamforming weight sets (e.g., different directional listening weight sets) applied to signals received at multiple antenna elements of an antenna array, or by processing received signals according to different receive beamforming weight sets applied to signals received at multiple antenna elements of an antenna array, any of which may be referred to as "listening" according to different receive configurations or receive directions. In some examples, a receiving device may use a single receive configuration to receive along a single beam direction (e.g., when receiving a data signal). The single receive configuration may be aligned along a beam direction determined based on listening according to different receive configuration directions (e.g., a beam direction determined to have a highest signal strength, highest signal-to-noise ratio (SNR), or otherwise acceptable signal quality based on listening according to multiple beam directions).

The wireless communications system 100 may be a packet-based network that operates according to a layered protocol stack. In the user plane, communications at the bearer or PDCP layer may be IP-based. An RLC layer may perform packet segmentation and reassembly to communicate over logical channels. A MAC layer may perform priority handling and multiplexing of logical channels into transport channels. The MAC layer may also use error detection techniques, error correction techniques, or both to support retransmissions at the MAC layer to improve link efficiency. In the control plane, the RRC protocol layer may provide establishment, configuration, and maintenance of an RRC connection between a UE 115 and a network entity 105 or a core network 130 supporting radio bearers for user plane data. At the PHY layer, transport channels may be mapped to physical channels.

The UEs 115 and the network entities 105 may support retransmissions of data to increase the likelihood that data is received successfully. Hybrid automatic repeat request (HARQ) feedback is one technique for increasing the likelihood that data is received correctly over a communication link (e.g., a communication link 125, a D2D communication link 135). HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., low signal-to-noise conditions). In some examples, a device may support same-slot HARQ feedback, where the device may provide HARQ feedback in a specific slot for data received in a previous symbol in the slot. In some other examples, the device may provide HARQ feedback in a subsequent slot, or according to some other time interval.

In some examples, a first device (e.g., a UE 115 or a base station 105) may provide CSI to a second device (e.g., a UE 115 or a base station) that includes feedback related to a channel between the first device and the second device. The second device may then encode a message using a level of redundancy (e.g., based on a coding scheme) that corresponds to an acceptable BLER for the message. An ARQ scheme such as HARQ may be used to transmit additional redundancy information when the first device fails to successfully decode a message. However, continuously using a level of redundancy that achieves a desired BLER may result in unnecessary redundancy information included for some messages (e.g., where the message could have been decoded with less redundancy information).

In order to reduce the amount of unnecessary redundancy information, the second device may implement a multiple incremental redundancy scheme. For instance, the second device may initially transmit a transmission with no or a reduced amount of redundancy. If the first device indicates to the second device that it has failed to receive at least a portion of the transmission, the second device may transmit a retransmission with redundancy information for the previous retransmission. The second device may continue to send additional redundancy information in each following retransmission of the transmission until the first device successfully decodes the message in the transmission.

The present disclosure may describe methods for implementing MIRS using a linear rateless code. For instance, the second device may split a transmission, which may include a block of data, into a set of sub-blocks and may apply a matrix to each sub-block of the set of sub-blocks in order to generate the encoded bits. The encoded bits for each sub-block may, for instance, include a first portion that is the same as the bits of the respective sub-block and a second portion that includes redundancy information. After performing the encoding, the second device may transmit at least a portion of the encoded bits for each sub-block. For instance, for an initial transmission, the second device may transmit the first portion of the encoded bits for each sub-block (e.g., the second device may not transmit redundancy information initially). The first device may determine whether it has successfully received and decoded each sub-block and may provide an indication of one or more sub-blocks that the first device has failed to receive. The second device may receive the indication of the one or more sub-blocks and may transmit additional redundancy information (e.g., bits from the second portion) for the indicated one or more sub-blocks such that the overall amount of redundancy increases. By including additional redundancy information for the indicated one or more sub-blocks, the second wireless device may increase the likelihood that the first wireless device successfully decodes the one or more sub-blocks. Additionally, in examples in which the second wireless device refrains from including additional redundancy information for the other sub-blocks of the set that are excluded from the one or more sub-blocks, the transmissions for the block of data may have decreased overhead relative to transmissions in which the amount of redundancy information is set at a same level for each sub-block.

Figure 2:
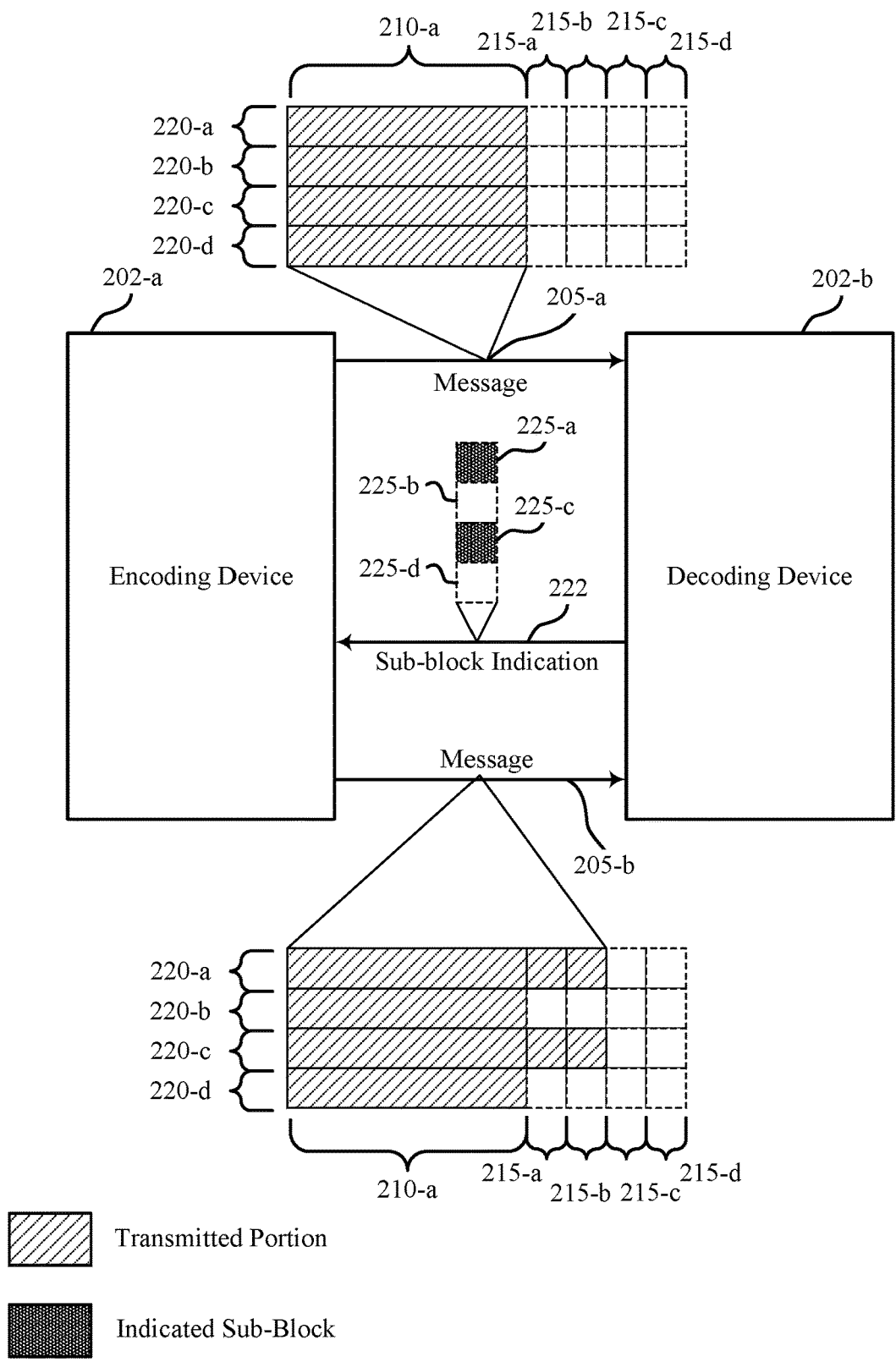
FIG. 2 illustrates an example of a wireless communications system that supports a multiple incremental redundancy scheme using linear rateless codes in accordance with one or more aspects of the present disclosure.

FIG. 2 illustrates an example of a wireless communications system 200 that supports a multiple incremental redundancy scheme using linear rateless codes in accordance with one or more aspects of the present disclosure. In some examples, wireless communications system 200 may implement one or more aspects of wireless communications system 100. For instance, encoding device 202-a and decoding device 202-b may each be an example of a UE 115 as described with reference to FIG. 1 or a network entity 105 as described with reference to FIG. 1.

As described herein, encoding device 202-a and decoding device 202-b may implement MIRS. For instance, at an initial time, encoding device 202-a may transmit a message 205-a to decoding device 202-b. The message 205-a may include data 210-a that is split among sub-block rows 220-a, 220-b, 220-c, and 220-d. For instance, each of sub-block rows 220-a, 220-b, 220-c, and 220-d may include a respective set of bits corresponding to a respective portion of the data 210-a. In some examples, the encoding device 202-a may generate parity columns 215-a, 215-b, 215-c, and 215-d for each of sub-block rows 220-a, 220-b, 220-c, and 220-d. For instance, in the present example, parity column 215-a may include one bit of redundancy information for sub-block row 220-a, one bit of redundancy information for sub-block row 220-b, one bit of redundancy information for sub-block row 220-c, and one bit of redundancy information for sub-block row 220-d.

In some examples, the encoding device 202-a may generate the parity columns 215-a, 215-b, 215-c, and 215-d for each sub-block based on applying a matrix associated with a linear rateless code to each sub-block. For instance, encoding device 202-a may apply the matrix to the data 210-a for each sub-block and may generate a set of encoded bits that includes the data 210-a for the sub-block and bits associated with the parity columns 215-a, 215-b, 215-c, and 215-d.

In some examples, a linear code may be defined as C(n, k, d), where n is a maximal length of an encoded codeword (e.g., of an encoded set of bits of a sub-block), k is the length of data 210-a (e.g., a length of data bits), and d is a minimal Hamming distance for the code. The maximal rate may be defined as R $$R = \frac{k}{n}$$

and a systematic generating matrix may be defined as $G=[I_{k \times k} \ P_{k \times (n-k)}]$. Additionally, a parity check matrix H may be defined as $H=[-P_{(n-k) \times k}^T \ I_{(n-k) \times (n-k)}]$ such that $HG^T=0$.

In one example, the generating matrix G may be generated using a first approach (e.g., a greedy approach). For instance, a first generating matrix $G(n_1, k, d_1)$ may be used for an initial transmission (e.g., a size k×k matrix with $d_{min}=0$). For a retransmission, the rate R may be decreased by increasing $n_1$ to $n_2$ (e.g., adding a new column of redundancy information, such as parity column 215-a) and acquiring $G(n_2, k, d_2)$, where $n_2$ may, for instance, equal $n_1+1$ and $d_2 \in \{d_1, d_1+1\}$. $G(n_2, k, d_2)$ may be acquired by looping over each $2^k$ codewords and selecting the parity column that results in a maximal increase in $d_{min}$. If multiple columns result in a same $d_{min}$, the column that has the minimal number of codewords with Hamming distance $d_{min}$ may be selected. The process may be repeated until reaching a given value of $n \geq n_2$. In some examples, multiple columns may be added per iteration (e.g., $n_2$ may equal $n_1+2$).

In another example, a generating matrix may be selected (e.g., $G_c$ (24, 12, 3)) and each parity column may be added to a list. An initial diagonal matrix G of size k×k and corresponding to $d_{min}=0$ may be selected. Each possible parity column may be looped over and the parity column that results in a maximal increase in $d_{min}$ may be selected. If multiple columns result in the same $d_{min}$, the column that has the minimal number of codewords with Hamming distance $d_{min}$ may be selected. The process may be repeated until each parity column $G_c$ has been rearranged. Performing this process may converge to $G_c$ after n−k steps. Additional information for how this matrix is generated may be described herein, for instance, with reference to FIG. 3.

After encoding device 202-a transmits the message 205-a, decoding device 202-b may determine if decoding device 202-b has successfully received and decoded each sub-block row 220-a, 220-b, 220-c, and 220-d. For instance, decoding device 202-b may generate one or more check values for candidate codewords of sub-block rows 220-a, 220-b, 220-c, and 220-d and may compare the one or more check values with a respective one or more check codes. If the check values match the check codes, the decoding device 202-b may determine a successful decoding. However, if the check values do not match, the decoding device 202-b may determine that decoding has failed. If the decoding device 202-b determines that the decoding device 202-b has failed to receive and/or decode a one or more sub-blocks, decoding device 202-b may transmit an indication 222 of the one or more sub-blocks to encoding device 202-a. For instance, in the present example, indication 222 may include sub-block indicator 225-a and sub-block indicator 225-c, which may correspond to sub-block rows 220-a and 220-c, respectively. Additionally indication 222 may include neither sub-block indicator 225-b nor sub-block indicator 225-d, which may correspond to sub-block rows 220-b and 220-d, respectively.

In some examples, decoding may be based on the decoding device 202-b evaluating a probability of each possible codeword in each sub-block (e.g., $2^k$ codewords), which may be referred to as a Maximum Likelihood Soft Decision approach. For instance, the decoding device 202-b may run over each sub-block row and, given y (e.g., soft-logarithmic likelihood ratios calculated from received samples), may calculate the probability of each codeword. The candidate codeword corresponding to a maximal correlation value may be selected. In some examples, the hard bits after decoding may be defined as $\hat{c}=\arg_{c \in C}{}^{max}\Sigma_i y_i \ast c\_bpsk_i$, where $c\_bpsk_i$ is a binary phase shift keying (BPSK) representation for an i–1th codeword. The decoding device 202-b may verify one or more successfully decoded cyclic redundancy checks (CRC) (e.g., a CRC added for the entire block of data 210-a or a CRC per sub-block row). In some examples, the decoding device 202-b may decode the rows that were expanded through feedback and may refrain from performing additional decoding on the other rows. In some examples, the decoding device 202-b may use previous correlation results and may add the additional LLRs to the correlations.

After decoding per row (e.g., upon failed CRC), the decoding device 202-b may determine which sub-block rows to indicate based on calculating the probability of a corrected codeword out of codewords for each sub-block row using an LLR correlation approach. For instance, for a sub-block row j, the decoding device 202-b may determine $$p_{corrected,j} = \arg\max_{c\_bpsk \in C\_bpsk} \sum_i y_{j,i} \ast c\_bpsk_i \text{ and}$$

$$p_{all\ CW,j} = \log\left(\sum_{c\_bpsk \in C\_bpsk} \exp\left(\sum_i y_{j,i} \ast c\_bpsk_i\right)\right).$$

Additionally, the decoding device 202-b may determine $$p_{ReTxCorrected,j} = \frac{p_{corrected,j}}{p_{all\ CW,j}}.$$

Out of each sub-block row, the decoding device 202-b may mark a least probable row index $$\left(\text{e.g., } ReTxBit = \arg\min_{j \in \left(\frac{rows}{columns}\right)} (p_{ReTxCorrected,j})\right)$$

and may request a retransmission for them. In some examples $p_{corrected,j}$ may be determined in a decoding stage and may be calculated incrementally per retransmission. Additionally, pall CW,j may be limited by selecting a subset of each possible codeword and not the entire list.

After encoding device 202-a receives the indication of the one or more sub-blocks, encoding device 202-a may add redundancy information to the indicated one or more sub-blocks. For instance, in the present example, encoding device 202-a may add redundancy information of parity columns 215-a and 215-b to sub-block rows 220-a and 220-c. Additionally, encoding device 202-a may refrain from adding redundancy information of parity columns 215-a and 215-b to sub-block rows 220-b and 220-d, as indication 222 did not indicate sub-block rows 220-b and 220-d. Additional redundancy information addition schemes are contemplated herein, for instance, with reference to FIGS. 4A, 4B, and 4C.

In some examples, the decoding device 202-b may identify a set of least probable sub-block rows according to retransmission granularity parameters. The encoding device 202-a may modify the pre-defined feedback ordered list and may insert the priority symbol index as part of a retransmission. In some examples, the feedback provided by decoding device 202-b may be augmented to a negative acknowledgement (NACK) message as part of a physical uplink shared channel (PUSCH) or a physical uplink control channel (PUCCH). In some examples, the decoding device 202-b may determine the probabilities of successful decoding of selected candidate codewords based on the LLRs associated with the selected candidate codewords (e.g., a post-decoding matrix identified after attempting to decode each sub-block row) or the LLRs associated with predecoded codewords (e.g., a pre-decoding matrix identified before attempting to decode each sub-block row).

In some examples, decoding device 202-b may indicate, to encoding device 202-a, which symbol of an ordered list of transmitted symbols to retransmit next, where each index of the list represents a retransmission index and where the ordered list of transmitted symbols may be identified (e.g., pre-configured) at encoding device 202-a and decoding device 202-b. For instance, decoding device 202-b may indicate an index of the list {12, 11, 9, 10, 7, 8, 6, 2, 1, 5, 3, 4}, where 12 is a transmission symbol for transmission N. In some examples, each symbol may include or may be an example of a row indicator (e.g., a line indicator) that may be indicated with (e.g., conveyed in a same transmission as) as an indication of a number of bits per row (e.g., a number of bits per line), such as $N_{BitsPerRow}$. After receiving transmission N, decoding device 202-b may feed back an indication 222 of sub-block rows and encoding device 202-a may change the ordered list according to the indication 222. For instance, for transmission N+1, the encoding device 202-a may puncture the ordered list based on the feedback report (e.g., based on the feedback prioritizing index 4 over index 11). In some such examples, the encoding device 202-a may move 4 in the list such that the list becomes {12, 4, 11, 9 10, 7, 8, 6, 2, 1, 5, 3, 4}. The present example may assume a retransmission granularity of $N_{Rows}=1$. However, other retransmission granularities are possible without deviating from the scope of the present disclosure. Encoding device 202-a may send message 205-b including redundancy information for one or more sub-blocks based at least in part on the indication 222.

By including additional redundancy information for the indication 222 of one or more sub-blocks, the encoding device 202-a may increase the likelihood that the decoding device 202-b successfully decodes the one or more sub-blocks. Additionally, in examples in which the decoding device 202-b refrains from including additional redundancy information for the other sub-blocks of the set that are excluded from the one or more sub-blocks, the transmission may have decreased overhead relative to transmissions in which the amount of redundancy information is increased for each sub-block. Additionally, generating the parity columns 215-a, 215-b, 215-c, and 215-d using the matrix associated with a linear rateless code may have advantages as compared to using other schemes to increase redundancy of a sub-block. For instance, a linear rateless code may have lower complexity as compared to other schemes (e.g., Spinal, low-density parity-check (LDPC)) and may also enable incremental coding (e.g., as compared to recalculating a code each time a retransmission is to be transmitted). Additionally, by starting at a lower redundancy and increasing redundancy with each transmission, the effective channel rate may be lower on average as compared to keeping a higher, fixed redundancy.

Figure 3:
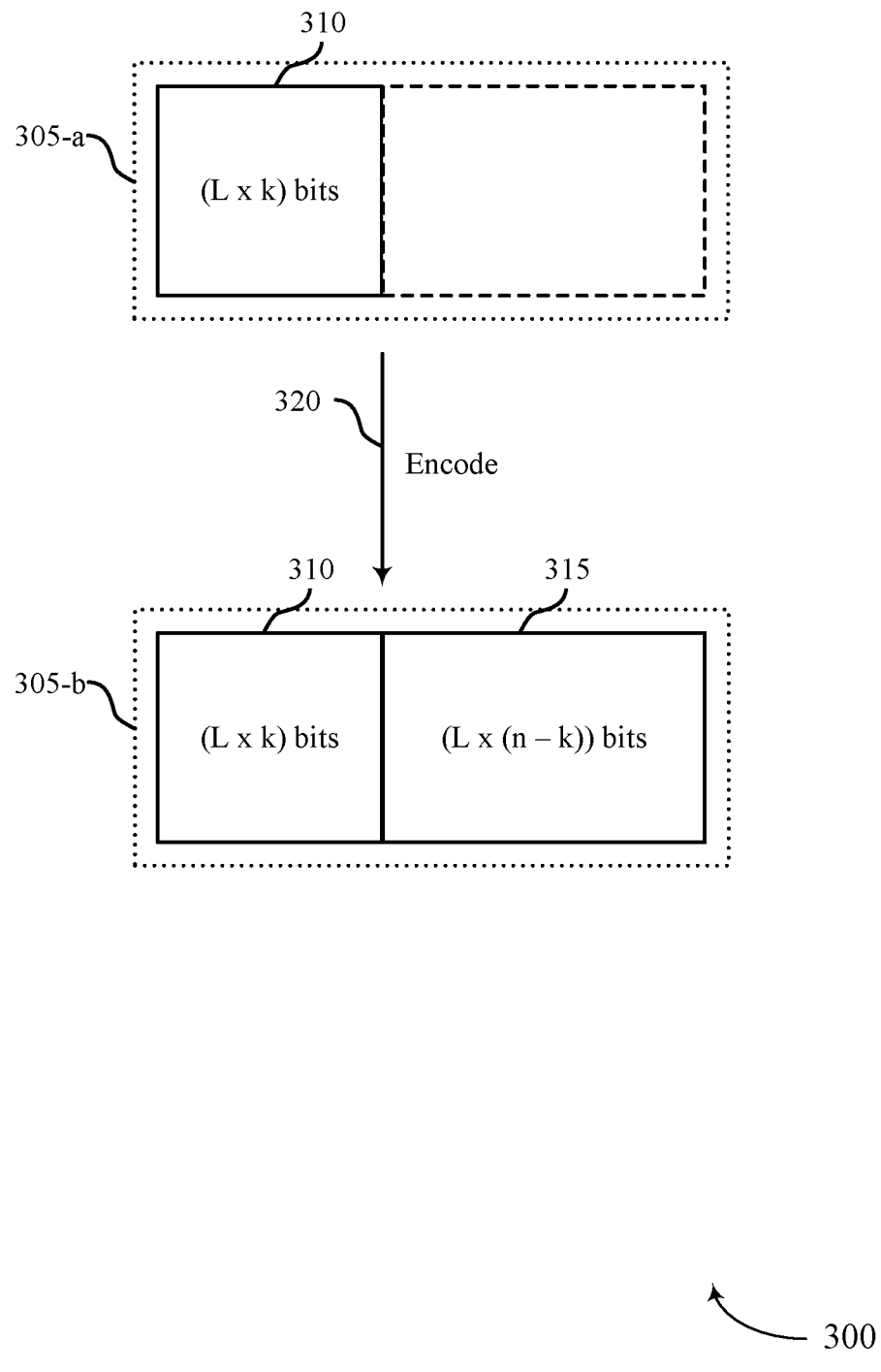
FIG. 3 illustrates an example of an encoding scheme that supports a multiple incremental redundancy scheme using linear rateless codes in accordance with one or more aspects of the present disclosure.

FIG. 3 illustrates an example of an encoding scheme 300 that supports a multiple incremental redundancy scheme using linear rateless codes in accordance with one or more aspects of the present disclosure. In some examples, encoding scheme 300 may be implemented by one or more aspects of wireless communications system 200. For instance, encoding scheme 300 may represent a scheme performed by an encoding device 202-a as described with reference to FIG. 2. in order to generate a set of encoded bits.

In some examples, at 305-a, an encoding device may identify a data payload 310 to be transmitted to a decoding device. In the present example, the data payload may have a size of L×k data bits that are broken into L rows of k bits. The encoding device may encode the L rows at 320 separately with a matrix (e.g., a linear code generating matrix) to create n bits per row (e.g., a total of L*n bits) at 305-b. For instance, L*k of the bits may be associated with a data payload 310 and L*(n−k) of the bits may be associated with parity columns 315.

Figure 4A:
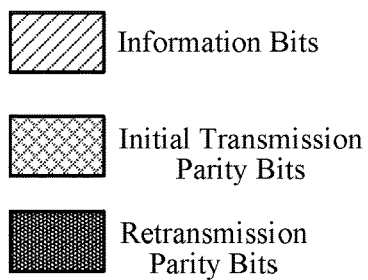
FIGS. 4A, 4B, and 4C illustrate examples of redundancy information addition schemes that supports a multiple incremental redundancy scheme using linear rateless codes in accordance with one or more aspects of the present disclosure.
Figure 4A:
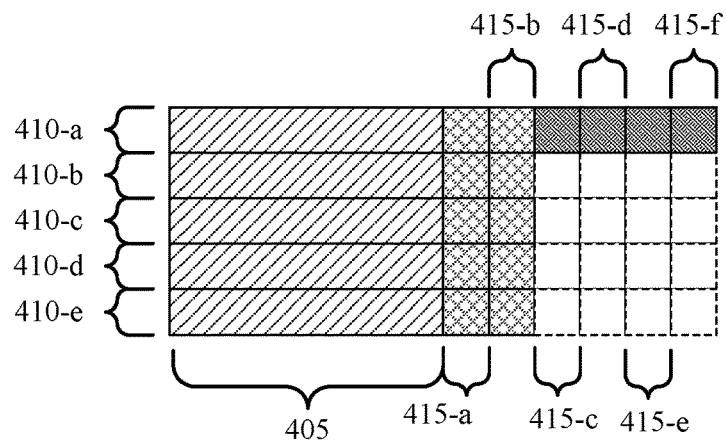
Figure 4B:
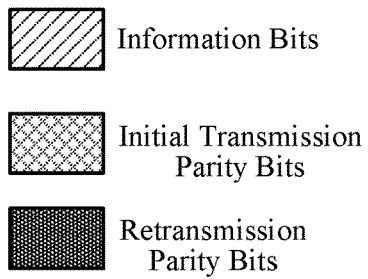
Figure 4B:
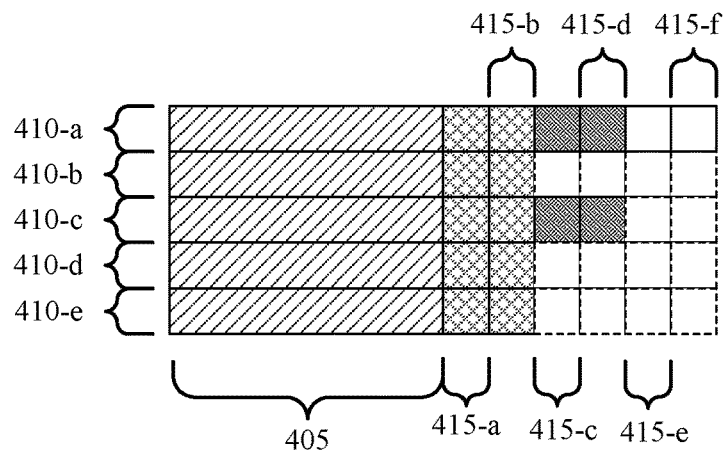
Figure 4C:
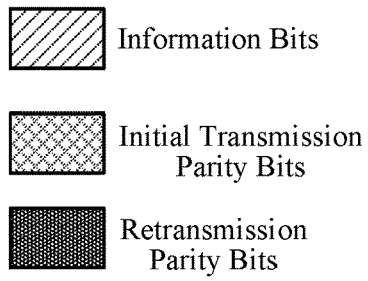
Figure 4C:
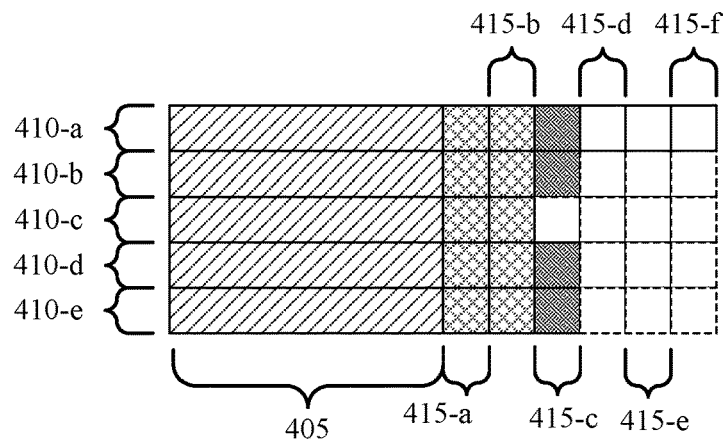

FIGS. 4A, 4B, and 4C illustrates examples of redundancy information addition schemes 400-a, 400-b, and 400-c that support a multiple incremental redundancy scheme using linear rateless codes in accordance with one or more aspects of the present disclosure. In some examples, redundancy information addition schemes 400-a, 400-b, and 400-c may be implemented by one or more aspects of wireless communications system 200. For instance, redundancy information addition schemes 400-a, 400-b, and 400-c may represent schemes performed by an encoding device 202-a as described with reference to FIG. 2. in order to add additional parity bits to a sub-block row.

As described herein, a first transmission may include L*k data bits (e.g., information bits) as well as one or more parity bits (e.g., uniformly distributed among sub-block rows according to a rate $R_{init}$. The feedback schemes described herein may enable additional parity bit to be added in a rateless manner until an acknowledgement (ACK) is received from a decoding device for a particular sub-block row. In some examples, an encoding device may implement a retransmission granularity according to which the encoding device may add parity bits. For instance, the encoding device may identify a number of bits to add per row $N_{BitsPerRow}$ as well as a number of rows for which to add bits $N_{Rows}$. As shown in redundancy information addition scheme 400-a, an initial rate may be given by $$R_{init} = \frac{k}{n_I},$$

an ending rate may be given by $$R_{end} = \frac{kL}{Ln_I + \Delta n}.$$

In such examples, a number of bits to add per retransmission may be given as $$s_{tx} = \frac{\Delta n}{Retx_{num}},$$

where $Retx_{num}$ may be defined as a total number of times that a retransmission may be performed. In some examples, each of the sub-block rows may be uncorrelated with each other.

The present examples may include data 405; sub-block rows 410-a, 410-b, 410-c, 410-d, and 410-e; and parity columns 415-a, 415-b, 415-c, 415-d, and 415-e. Data 405 may include the L*k data bits (e.g., information bits) and parity columns 415-a and 415-b may include parity bits transmitted with an initial transmission. As shown in FIG. 4A, if $N_{BitsPerRow}$=4, $N_{Rows}$=1, and a decoding device indicates sub-block row 410-a after receiving the initial transmission, the encoding device may add 4 parity bits to sub-block row 410-a (e.g., parity bits in parity columns 415-c, 415-d, 415-e, and 415-f). As shown in FIG. 4B, if $N_{BitsPerRow}$=2, $N_{Rows}$=2, and a decoding device indicates sub-block rows 410-a and 410-c after receiving the initial transmission, the encoding device may add 2 parity bits to each of sub-block rows 410-a and 410-c (e.g., parity bits in parity columns 415-c and 415-d). As shown in FIG. 4C, if $N_{BitsPerRow}$=1, $N_{Rows}$=4, and a decoding device indicates sub-block rows 410-a, 410-b, 410-d, and 410-e after receiving the initial transmission, the encoding device may add 1 parity bit to each of sub-block rows 410-a, 410-b, 410-d, and 410-e (e.g., parity bits in parity column 415-c).

Figure 5:
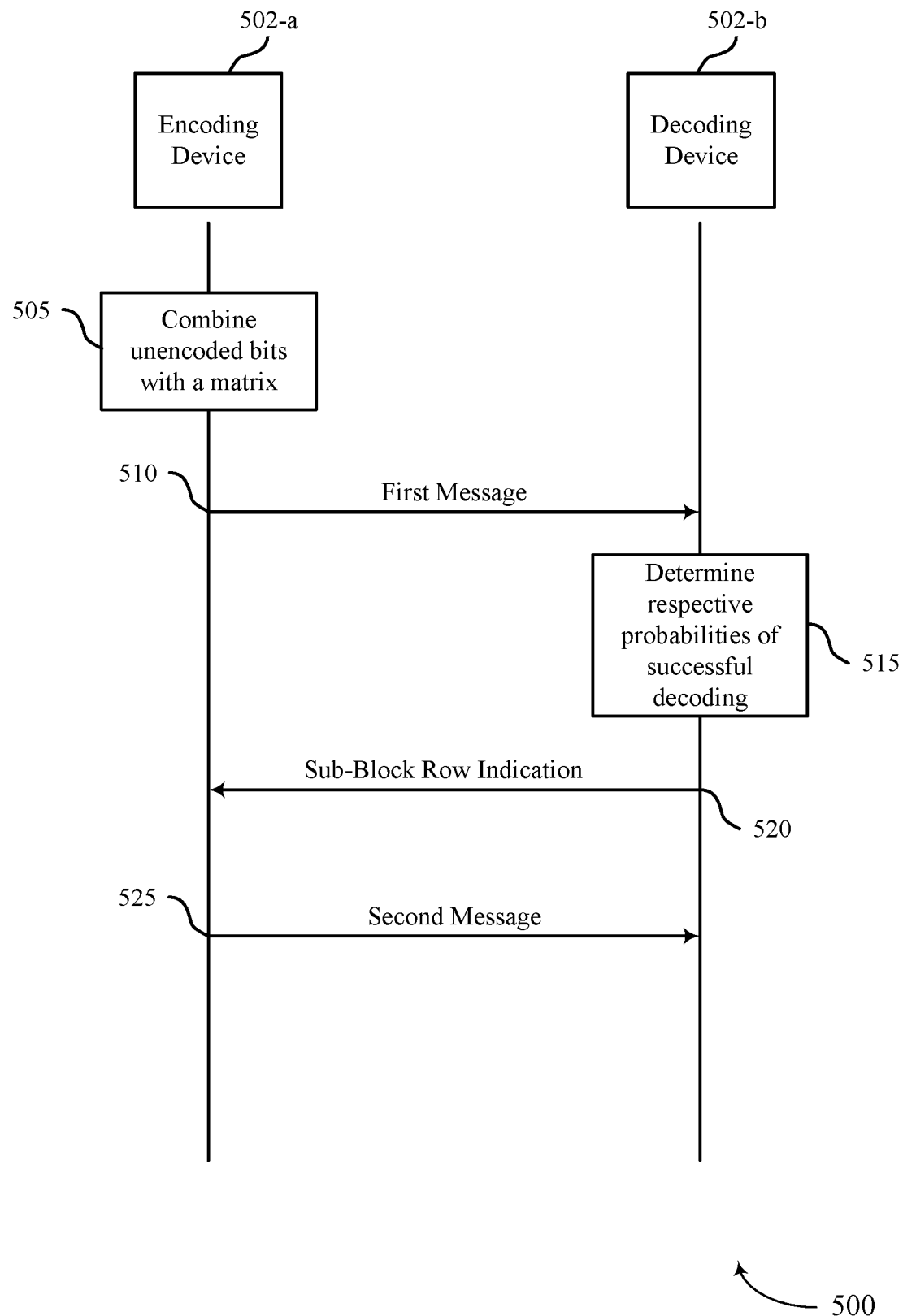
FIG. 5 illustrates an example of a process flow that supports a multiple incremental redundancy scheme using linear rateless codes in accordance with one or more aspects of the present disclosure.

FIG. 5 illustrates an example of a process flow 500 that supports a multiple incremental redundancy scheme using linear rateless codes in accordance with one or more aspects of the present disclosure. In some examples, process flow 500 may be implemented by one or more aspects of wireless communications system 200. For instance, encoding device 502-a may be an example of an encoding device 202-a as described with reference to FIG. 2 and decoding device 502-b may be an example of a decoding device 202-b as described with reference to FIG. 2.

At 505, the encoding device 502-a may combine, for each of a set of sub-blocks of a block of data, a set of unencoded bits associated with a respective sub-block with a matrix to generate a set of encoded bits. The matrix may include a first set of columns associated with an identity matrix and a second set of columns associated with a parity matrix, where the second set of columns are arranged in an order, and where each column of the second set of columns maximizes Hamming distance over each previous column in the order. In some examples, the order for the second set of columns may correspond to a second order that is rearranged from a first order of a linear block code.

At 510, encoding device 502-a may transmit a first message to decoding device 502-b that includes a block, where the block includes a set of sub-blocks.

At 515, decoding device 502-b may determine respective probabilities of successful decoding of respective selected candidate codewords for the set of sub-blocks of the block based on receiving the first message. In some examples, decoding device 502—may determine, for each sub-block of the set of sub-blocks and for each candidate codeword of a set of candidate codewords, a correlation of the respective candidate codeword against LLR associate with the respective sub-block. Additionally, the decoding device 502-b may select the respective selected candidate codewords based on determining the correlation for each sub-block of the set of sub-blocks and for each candidate codeword of the set of candidate codewords. In some examples, the respective set of candidate codewords for each sub-block may include each possible candidate codeword that has a length equal to that of the respective sub-block.

Additionally or alternatively, the respective probability of successful decoding for each respective selected candidate codeword may include a ratio of the correlation for the respective selected candidate codeword to a sum of correlations among one or more candidate codewords of the respective set of candidate codewords associated with the sub-block that the respective selected candidate codeword corresponds to, and where the correlation of the respective selected candidate codeword has a highest value among the respective set of candidate codewords associated with the sub-block that the respective selected candidate codeword corresponds to. In some examples, decoding device 502-b may decode a set of predecoded codewords to generate the respective selected candidate codewords, where determining the respective probabilities of successful decoding of respective selected candidate codewords is based on a first set of LLRs of bits associated with the respective selected candidate codewords or a second set of LLRs of bits associated with the set of predecoded codewords.

In some examples, the first message includes a check code. In some such examples, determining the respective probabilities of successful decoding of the respective selected candidate codewords may be based on determining a failure of a comparison of the check code for the block with a check value generated from the respective selected candidate codewords. Additionally or alternatively, the first message may include a set of check codes, where each check code of the set of check codes is associated with a respective sub-block of the set of sub-blocks. In some such examples, determining the respective probabilities of successful decoding of the respective selected candidate codewords may be based on determining a failure of the one or more check codes of the set of check codes with a check value generated from one or more of the respective selected codewords.

At 520, decoding device 502-b may transmit, to encoding device 502-a, one or more indicators associated with one or more sub-blocks of the block based on the respective probabilities of successful decoding of the respective selected candidate codewords. In some examples, decoding device 502-b may receive (e.g., from encoding device 502-a) an indication of a number of sub-blocks in the one or more sub-blocks, where transmitting the indicators is based on receiving the indication of the number of sub-blocks or the indication of the amount of redundancy information to be indicated in a second message. In some examples, encoding device 502-a may puncture an ordered list of symbols, where the puncturing may include identifying a next symbol for transmission on the ordered list; replacing the next symbol with another symbol on the ordered list based on receiving the one or more indicators associated with the one or more sub-blocks of the block and transmitting the other symbol based on the replacing. In some examples, each symbol may include or may be an example of a row indicator (e.g., a line indicator) that may be indicated with (e.g., conveyed in a same transmission as) as an indication of a number of bits per row (e.g., a number of bits per line), such as $N_{BitsPerRow}$.

At 525, encoding device 502-a may transmit, to decoding device 502-b, the second message including redundancy information for the one or more sub-blocks based on receiving the one or more indicators associated with the one or more sub-blocks. In some examples, the redundancy information includes a respective set of parity bits for each of the one or more sub-blocks. In some examples, a total number of parity bits associated with a first sub-block of the one or more sub-blocks after receiving the second message may be greater than a total number of parity bits associated with a second sub-block of the set of sub-blocks that is excluded from the one or more sub-blocks. Additionally or alternatively, a total number of parity bits associated with a first sub-block of the one or more sub-blocks after receiving the second message is greater than a total number of parity bits associated with a second sub-block of the one or more sub-blocks. Additionally or alternatively, the respective set of parity bits for each of the one or more sub-blocks are associated with a same number of parity bits.

Figure 6:
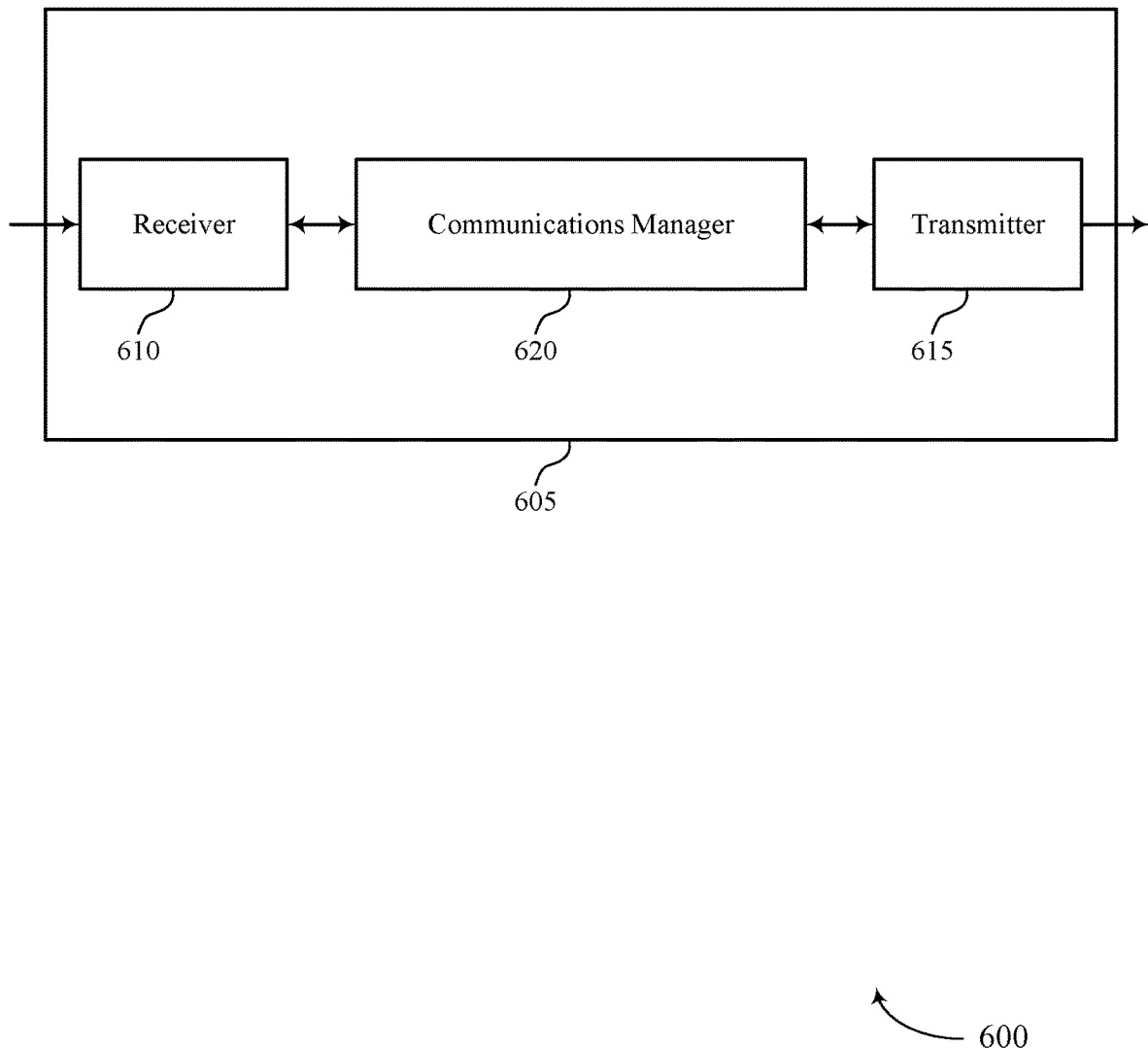
FIGS. 6 and 7 show block diagrams of devices that support a multiple incremental redundancy scheme using linear rateless codes in accordance with one or more aspects of the present disclosure.

FIG. 6 shows a block diagram 600 of a device 605 that supports a multiple incremental redundancy scheme using linear rateless codes in accordance with one or more aspects of the present disclosure. The device 605 may be an example of aspects of a UE 115, a network entity 105, an encoding device 202-a, or a decoding device 202-b as described herein. The device 605 may include a receiver 610, a transmitter 615, and a communications manager 620. The device 605 may also include a processor. Each of these components may be in communication with one another (e.g., via one or more buses).

The receiver 610 may provide a means for receiving information such as packets, user data, control information, or any combination thereof associated with various information channels (e.g., control channels, data channels, information channels related to a multiple incremental redundancy scheme using linear rateless codes). Information may be passed on to other components of the device 605. The receiver 610 may utilize a single antenna or a set of multiple antennas.

The transmitter 615 may provide a means for transmitting signals generated by other components of the device 605. For example, the transmitter 615 may transmit information such as packets, user data, control information, or any combination thereof associated with various information channels (e.g., control channels, data channels, information channels related to a multiple incremental redundancy scheme using linear rateless codes). In some examples, the transmitter 615 may be co-located with a receiver 610 in a transceiver module. The transmitter 615 may utilize a single antenna or a set of multiple antennas.

The communications manager 620, the receiver 610, the transmitter 615, or various combinations thereof or various components thereof may be examples of means for performing various aspects of a multiple incremental redundancy scheme using linear rateless codes as described herein. For example, the communications manager 620, the receiver 610, the transmitter 615, or various combinations or components thereof may support a method for performing one or more of the functions described herein.

In some examples, the communications manager 620, the receiver 610, the transmitter 615, or various combinations or components thereof may be implemented in hardware (e.g., in communications management circuitry). The hardware may include a processor, a digital signal processor (DSP), a central processing unit (CPU), an application-specific integrated circuit (ASIC), a field-programmable gate array (FPGA) or other programmable logic device, a microcontroller, discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally, or alternatively, in some examples, the communications manager 620, the receiver 610, the transmitter 615, or various combinations or components thereof may be implemented in code (e.g., as communications management software or firmware) executed by a processor. If implemented in code executed by a processor, the functions of the communications manager 620, the receiver 610, the transmitter 615, or various combinations or components thereof may be performed by a general-purpose processor, a DSP, a CPU, an ASIC, an FPGA, a microcontroller, or any combination of these or other programmable logic devices (e.g., configured as or otherwise supporting a means for performing the functions described in the present disclosure).

In some examples, the communications manager 620 may be configured to perform various operations (e.g., receiving, obtaining, monitoring, outputting, transmitting) using or otherwise in cooperation with the receiver 610, the transmitter 615, or both. For example, the communications manager 620 may receive information from the receiver 610, send information to the transmitter 615, or be integrated in combination with the receiver 610, the transmitter 615, or both to obtain information, output information, or perform various other operations as described herein.

The communications manager 620 may support wireless communication in accordance with examples as disclosed herein. For example, the communications manager 620 may be configured as or otherwise support a means for receiving a first message including a block, the block including a set of multiple sub-blocks. The communications manager 620 may be configured as or otherwise support a means for determining respective probabilities of successful decoding of respective selected candidate codewords for the set of multiple sub-blocks of the block based on receiving the first message. The communications manager 620 may be configured as or otherwise support a means for transmitting one or more indicators associated with one or more sub-blocks of the block based on the respective probabilities of successful decoding of the respective selected candidate codewords. The communications manager 620 may be configured as or otherwise support a means for receiving a second message including redundancy information for the one or more sub-blocks based on transmitting the one or more indicators associated with the one or more sub-blocks.

Additionally, or alternatively, the communications manager 620 may support wireless communication in accordance with examples as disclosed herein. For example, the communications manager 620 may be configured as or otherwise support a means for combining, for each of a set of multiple sub-blocks of a block of data, a set of unencoded bits associated with a respective sub-block with a matrix to generate a set of encoded bits, where the matrix includes a first set of columns associated with an identity matrix and a second set of columns associated with a parity matrix, where the second set of columns are arranged in an order, and where each column of the second set of columns maximizes hamming distance over each previous column in the order. The communications manager 620 may be configured as or otherwise support a means for transmitting a first message including the block. The communications manager 620 may be configured as or otherwise support a means for receiving one or more indicators associated with one or more sub-blocks of the block. The communications manager 620 may be configured as or otherwise support a means for transmitting a second message including redundancy information for the one or more sub-blocks based on receiving the one or more indicators associated with the one or more sub-blocks.

By including or configuring the communications manager 620 in accordance with examples as described herein, the device 605 (e.g., a processor controlling or otherwise coupled with the receiver 610, the transmitter 615, the communications manager 620, or a combination thereof) may support techniques for the device 605 to increase the likelihood that the device 605 or another device successfully decodes the one or more sub-blocks while also limiting overhead.

Figure 7:
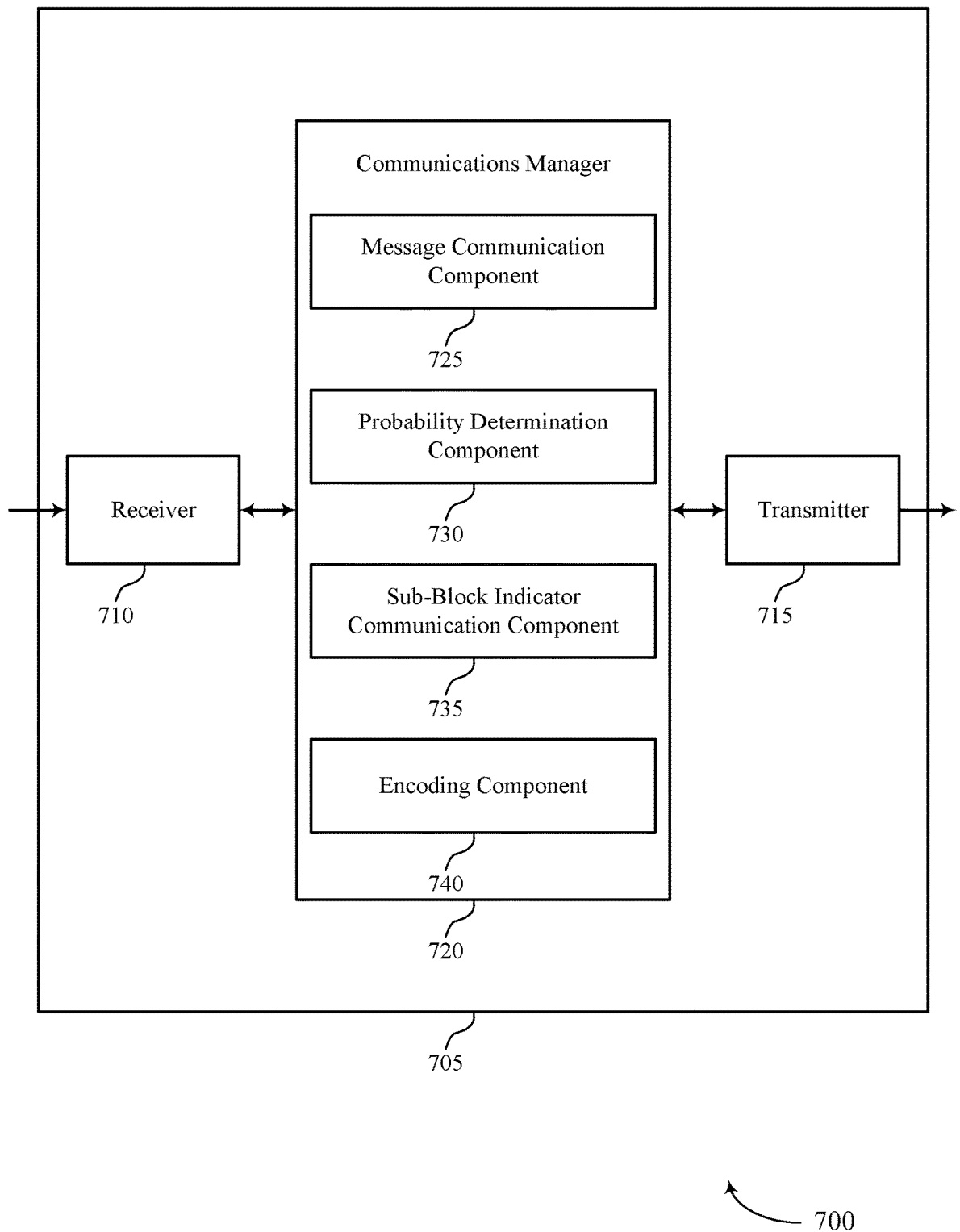

FIG. 7 shows a block diagram 700 of a device 705 that supports a multiple incremental redundancy scheme using linear rateless codes in accordance with one or more aspects of the present disclosure. The device 705 may be an example of aspects of a device 605, a UE 115, a network entity 105, an encoding device 202-a, or a decoding device 202-b as described herein. The device 705 may include a receiver 710, a transmitter 715, and a communications manager 720. The device 705 may also include a processor. Each of these components may be in communication with one another (e.g., via one or more buses).

The receiver 710 may provide a means for receiving information such as packets, user data, control information, or any combination thereof associated with various information channels (e.g., control channels, data channels, information channels related to a multiple incremental redundancy scheme using linear rateless codes). Information may be passed on to other components of the device 705. The receiver 710 may utilize a single antenna or a set of multiple antennas.

The transmitter 715 may provide a means for transmitting signals generated by other components of the device 705. For example, the transmitter 715 may transmit information such as packets, user data, control information, or any combination thereof associated with various information channels (e.g., control channels, data channels, information channels related to a multiple incremental redundancy scheme using linear rateless codes). In some examples, the transmitter 715 may be co-located with a receiver 710 in a transceiver module. The transmitter 715 may utilize a single antenna or a set of multiple antennas.

The device 705, or various components thereof, may be an example of means for performing various aspects of a multiple incremental redundancy scheme using linear rateless codes as described herein. For example, the communications manager 720 may include a message communication component 725, a probability determination component 730, a sub-block indicator communication component 735, an encoding component 740, or any combination thereof. The communications manager 720 may be an example of aspects of a communications manager 620 as described herein. In some examples, the communications manager 720, or various components thereof, may be configured to perform various operations (e.g., receiving, obtaining, monitoring, outputting, transmitting) using or otherwise in cooperation with the receiver 710, the transmitter 715, or both. For example, the communications manager 720 may receive information from the receiver 710, send information to the transmitter 715, or be integrated in combination with the receiver 710, the transmitter 715, or both to obtain information, output information, or perform various other operations as described herein.

The communications manager 720 may support wireless communication in accordance with examples as disclosed herein. The message communication component 725 may be configured as or otherwise support a means for receiving a first message including a block, the block including a set of multiple sub-blocks. The probability determination component 730 may be configured as or otherwise support a means for determine respective probabilities of successful decoding of respective selected candidate codewords for the set of multiple sub-blocks of the block based on receiving the first message. The sub-block indicator communication component 735 may be configured as or otherwise support a means for transmitting one or more indicators associated with one or more sub-blocks of the block based on the respective probabilities of successful decoding of the respective selected candidate codewords. The message communication component 725 may be configured as or otherwise support a means for receiving a second message including redundancy information for the one or more sub-blocks based on transmitting the one or more indicators associated with the one or more sub-blocks.

Additionally, or alternatively, the communications manager 720 may support wireless communication in accordance with examples as disclosed herein. The encoding component 740 may be configured as or otherwise support a means for combining, for each of a set of multiple sub-blocks of a block of data, a set of unencoded bits associated with a respective sub-block with a matrix to generate a set of encoded bits, where the matrix includes a first set of columns associated with an identity matrix and a second set of columns associated with a parity matrix, where the second set of columns are arranged in an order, and where each column of the second set of columns maximizes hamming distance over each previous column in the order. The message communication component 725 may be configured as or otherwise support a means for transmitting a first message including the block. The sub-block indicator communication component 735 may be configured as or otherwise support a means for receiving one or more indicators associated with one or more sub-blocks of the block. The message communication component 725 may be configured as or otherwise support a means for transmitting a second message including redundancy information for the one or more sub-blocks based on receiving the one or more indicators associated with the one or more sub-blocks.

Figure 8:
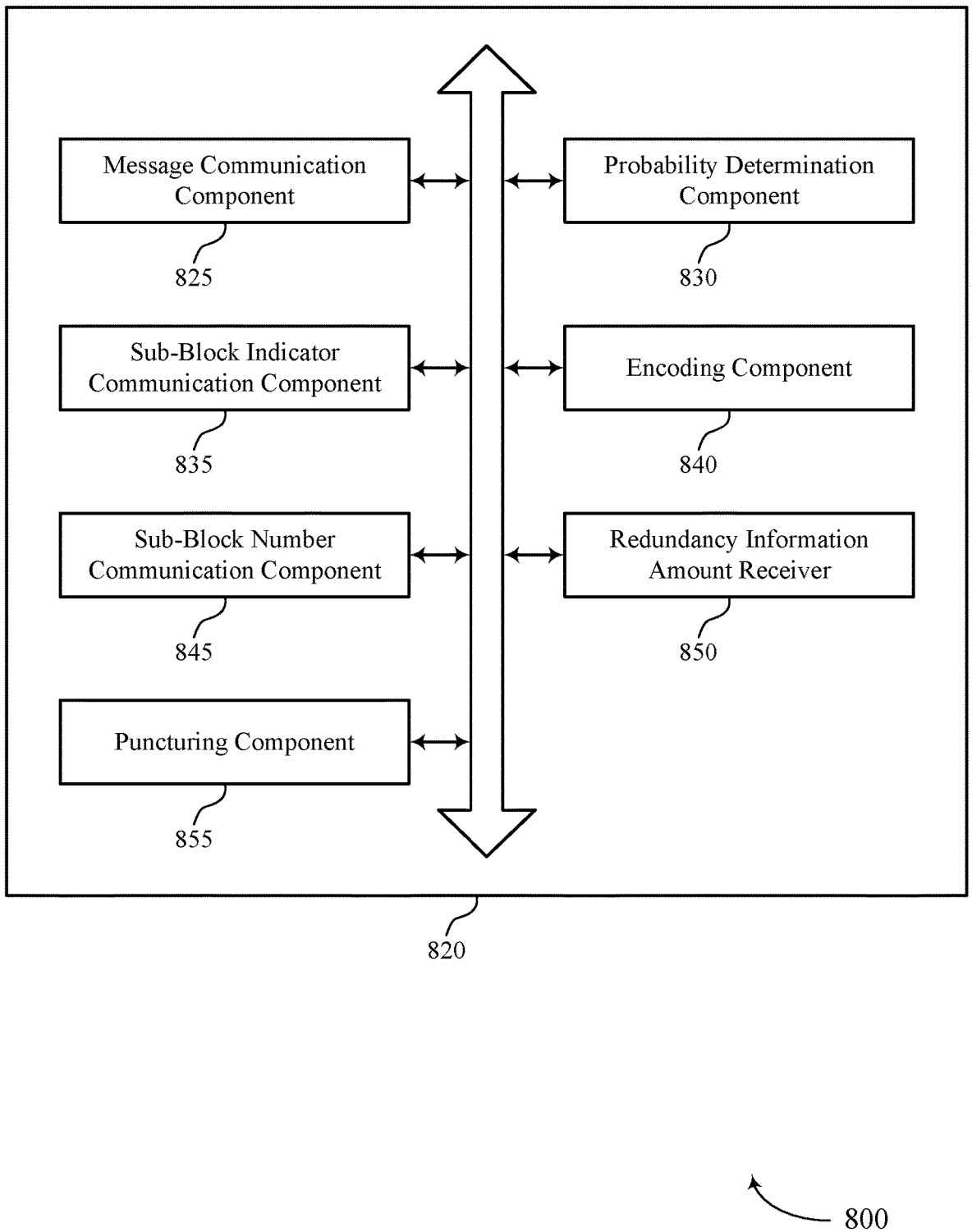
FIG. 8 shows a block diagram of a communications manager that supports a multiple incremental redundancy scheme using linear rateless codes in accordance with one or more aspects of the present disclosure.

FIG. 8 shows a block diagram 800 of a communications manager 820 that supports a multiple incremental redundancy scheme using linear rateless codes in accordance with one or more aspects of the present disclosure. The communications manager 820 may be an example of aspects of a communications manager 620, a communications manager 720, or both, as described herein. The communications manager 820, or various components thereof, may be an example of means for performing various aspects of a multiple incremental redundancy scheme using linear rateless codes as described herein. For example, the communications manager 820 may include a message communication component 825, a probability determination component 830, a sub-block indicator communication component 835, an encoding component 840, a sub-block number communication component 845, a redundancy information amount receiver 850, a puncturing component 855, or any combination thereof. Each of these components may communicate, directly or indirectly, with one another (e.g., via one or more buses).

The communications manager 820 may support wireless communication in accordance with examples as disclosed herein. The message communication component 825 may be configured as or otherwise support a means for receiving a first message including a block, the block including a set of multiple sub-blocks. The probability determination component 830 may be configured as or otherwise support a means for determine respective probabilities of successful decoding of respective selected candidate codewords for the set of multiple sub-blocks of the block based on receiving the first message. The sub-block indicator communication component 835 may be configured as or otherwise support a means for transmitting one or more indicators associated with one or more sub-blocks of the block based on the respective probabilities of successful decoding of the respective selected candidate codewords. In some examples, the message communication component 825 may be configured as or otherwise support a means for receiving a second message including redundancy information for the one or more sub-blocks based on transmitting the one or more indicators associated with the one or more sub-blocks.

In some examples, the sub-block number communication component 845 may be configured as or otherwise support a means for receiving an indication of a number of sub-blocks in the one or more sub-blocks, where transmitting the one or more indicators associated with the one or more sub-blocks is based on the indication of the number of sub-blocks.

In some examples, the redundancy information amount receiver 850 may be configured as or otherwise support a means for receiving an indication of an amount of redundancy information to be indicated in the second message for each of the one or more sub-blocks, where transmitting the one or more indicators associated with the one or more sub-blocks of the set of multiple sub-blocks is based on receiving the indication of the amount of redundancy information.

In some examples, the probability determination component 830 may be configured as or otherwise support a means for determining, for each sub-block of the set of multiple sub-blocks and for each candidate codeword of a set of candidate codewords, a correlation of the respective candidate codeword against a logarithmic likelihood ratio associated with the respective sub-block. In some examples, the probability determination component 830 may be configured as or otherwise support a means for selecting the respective selected candidate codewords for the set of multiple sub-blocks based on determining the correlation for each sub-block of the set of multiple sub-blocks and for each candidate codeword of the set of candidate codewords.

In some examples, the respective set of candidate codewords for each sub-block of the set of multiple sub-blocks includes each possible candidate codeword that has a length equal to that of the respective sub-block.

In some examples, the respective probability of successful decoding for each respective selected candidate codeword includes a ratio of the correlation for the respective selected candidate codeword to a sum of correlations among one or more candidate codewords of the respective set of candidate codewords associated with the sub-block that the respective selected candidate codeword corresponds to. In some examples, the correlation of the respective selected candidate codeword has a highest value among the respective set of candidate codewords associated with the sub-block that the respective selected candidate codeword corresponds to.

In some examples, the probability determination component 830 may be configured as or otherwise support a means for decoding a set of predecoded codewords to generate the respective selected candidate codewords, where determining the respective probabilities of successful decoding of respective selected candidate codewords is based on a first set of logarithmic likelihood ratios of bits associated with the respective selected candidate codewords or a second set of logarithmic likelihood ratios of bits associated with the set of predecoded codewords.

In some examples, the redundancy information includes a respective set of parity bits for each of the one or more sub-blocks.

In some examples, a total number of parity bits associated with a first sub-block of the one or more sub-blocks after receiving the second message is greater than a total number of parity bits associated with a second sub-block of the set of multiple sub-blocks that is excluded from the one or more sub-blocks.

In some examples, a total number of parity bits associated with the first sub-block of the one or more sub-blocks after receiving the second message is greater than a total number of parity bits associated with a second sub-block of the one or more sub-blocks.

In some examples, the respective set of parity bits for each of the one or more sub-blocks are associated with a same number of parity bits.

In some examples, the first message includes a check code. In some examples, determining the respective probabilities of successful decoding of the respective selected candidate codewords is based on determining a failure of a comparison of the check code for the block with a check value generated from the respective selected candidate codewords.

In some examples, the first message includes a set of check codes. In some examples, each check code of the set of check codes corresponds to a respective sub-block of the set of multiple sub-blocks.

In some examples, the first message includes a set of check codes. In some examples, each check code of the set of check codes is associated with a respective sub-block of the set of multiple sub-blocks. In some examples, determining the respective probabilities of successful decoding of the respective selected candidate codewords is based on determining a failure of one or more check codes of the set of check codes with a check value generated from one or more of the respective selected candidate codewords.

Additionally, or alternatively, the communications manager 820 may support wireless communication in accordance with examples as disclosed herein. The encoding component 840 may be configured as or otherwise support a means for combining, for each of a set of multiple sub-blocks of a block of data, a set of unencoded bits associated with a respective sub-block with a matrix to generate a set of encoded bits, where the matrix includes a first set of columns associated with an identity matrix and a second set of columns associated with a parity matrix, where the second set of columns are arranged in an order, and where each column of the second set of columns maximizes hamming distance over each previous column in the order. In some examples, the message communication component 825 may be configured as or otherwise support a means for transmitting a first message including the block. In some examples, the sub-block indicator communication component 835 may be configured as or otherwise support a means for receiving one or more indicators associated with one or more sub-blocks of the block. In some examples, the message communication component 825 may be configured as or otherwise support a means for transmitting a second message including redundancy information for the one or more sub-blocks based on receiving the one or more indicators associated with the one or more sub-blocks.

In some examples, the sub-block number communication component 845 may be configured as or otherwise support a means for transmitting an indication of a number of sub-blocks in the one or more sub-blocks, where receiving the one or more indicators associated with the one or more sub-blocks is based on the indication of the number of sub-blocks.

In some examples, the redundancy information amount receiver 850 may be configured as or otherwise support a means for transmitting an indication of an amount of redundancy information to be indicated in the second message for each of the one or more sub-blocks, where receiving the one or more indicators associated with the one or more sub-blocks of the set of multiple sub-blocks is based on transmitting the indication of the amount of redundancy information.

In some examples, the puncturing component 855 may be configured as or otherwise support a means for puncturing an ordered list of symbols, where the puncturing includes. In some examples, the puncturing component 855 may be configured as or otherwise support a means for identifying a next symbol for transmission on the ordered list. In some examples, the puncturing component 855 may be configured as or otherwise support a means for replacing the next symbol with another symbol on the ordered list based on receiving the one or more indicators associated with the one or more sub-blocks of the block. In some examples, the puncturing component 855 may be configured as or otherwise support a means for transmitting the other symbol based on the replacing.

In some examples, the order for the second set of columns corresponds to a second order that is rearranged from a first order of a linear block code.

In some examples, the redundancy information includes a respective set of parity bits for each of the one or more sub-blocks.

In some examples, the first message includes a check code for the block.

Figure 9:
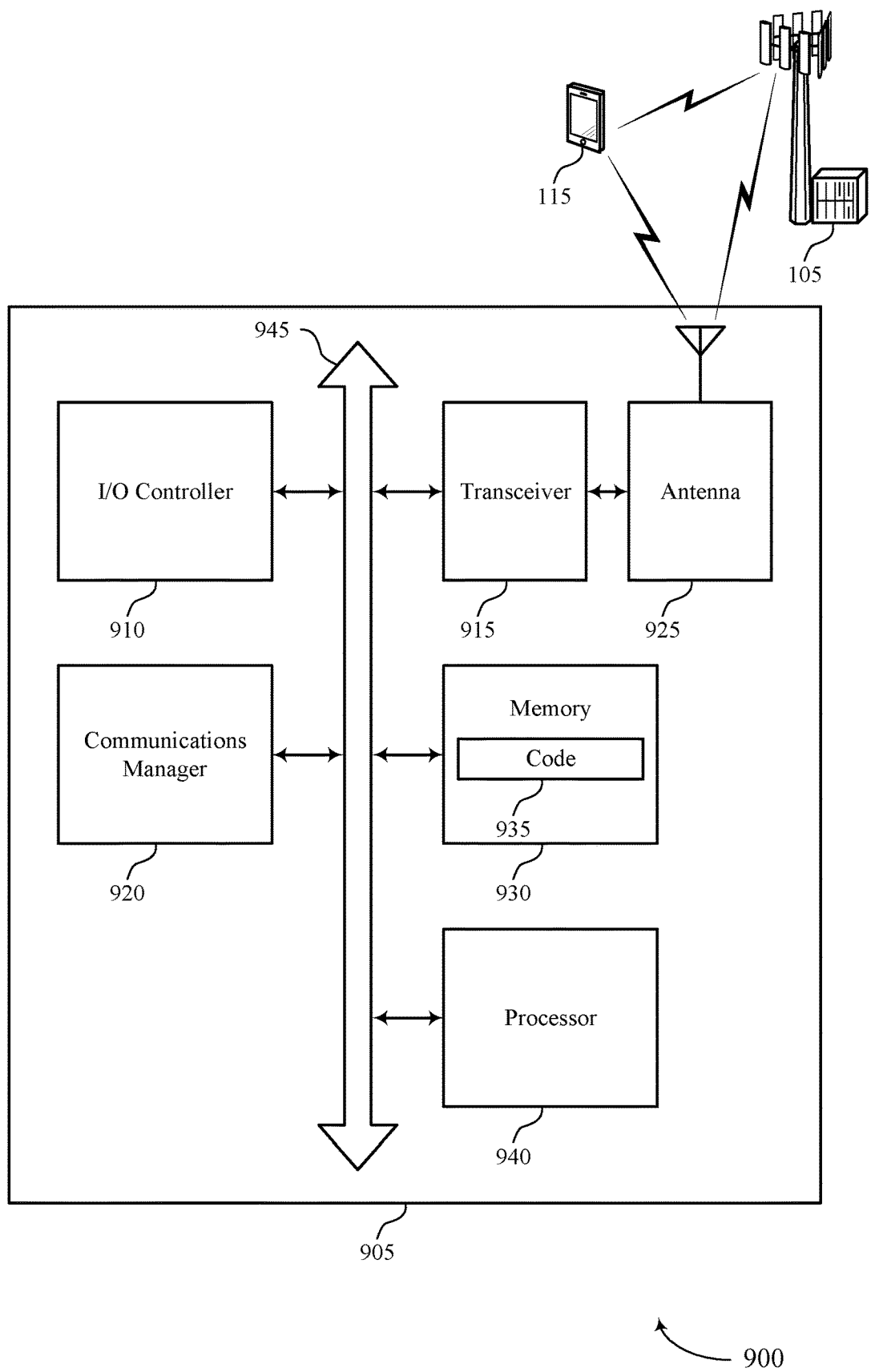
FIG. 9 shows a diagram of a system including a device that supports a multiple incremental redundancy scheme using linear rateless codes in accordance with one or more aspects of the present disclosure.

FIG. 9 shows a diagram of a system 900 including a device 905 that supports a multiple incremental redundancy scheme using linear rateless codes in accordance with one or more aspects of the present disclosure. The device 905 may be an example of or include the components of a device 605, a device 705, a UE 115, a network entity 105, an encoding device 202-a, or a decoding device 202-b as described herein. The device 905 may communicate (e.g., wirelessly) with one or more network entities 105, one or more UEs 115, or any combination thereof. The device 905 may include components for bi-directional voice and data communications including components for transmitting and receiving communications, such as a communications manager 920, an input/output (I/O) controller 910, a transceiver 915, an antenna 925, a memory 930, code 935, and a processor 940. These components may be in electronic communication or otherwise coupled (e.g., operatively, communicatively, functionally, electronically, electrically) via one or more buses (e.g., a bus 945).

The I/O controller 910 may manage input and output signals for the device 905. The I/O controller 910 may also manage peripherals not integrated into the device 905. In some cases, the I/O controller 910 may represent a physical connection or port to an external peripheral. In some cases, the I/O controller 910 may utilize an operating system such as iOS®, ANDROID®, MS-DOS®, MS-WINDOWS®, OS/2®, UNIX®, LINUX®, or another known operating system. Additionally or alternatively, the I/O controller 910 may represent or interact with a modem, a keyboard, a mouse, a touchscreen, or a similar device. In some cases, the I/O controller 910 may be implemented as part of a processor, such as the processor 940. In some cases, a user may interact with the device 905 via the I/O controller 910 or via hardware components controlled by the I/O controller 910.

In some cases, the device 905 may include a single antenna 925. However, in some other cases, the device 905 may have more than one antenna 925, which may be capable of concurrently transmitting or receiving multiple wireless transmissions. The transceiver 915 may communicate bi-directionally, via the one or more antennas 925, wired, or wireless links as described herein. For example, the transceiver 915 may represent a wireless transceiver and may communicate bi-directionally with another wireless transceiver. The transceiver 915 may also include a modem to modulate the packets, to provide the modulated packets to one or more antennas 925 for transmission, and to demodulate packets received from the one or more antennas 925. The transceiver 915, or the transceiver 915 and one or more antennas 925, may be an example of a transmitter 615, a transmitter 715, a receiver 610, a receiver 710, or any combination thereof or component thereof, as described herein.

The memory 930 may include random access memory (RAM) and read-only memory (ROM). The memory 930 may store computer-readable, computer-executable code 935 including instructions that, when executed by the processor 940, cause the device 905 to perform various functions described herein. The code 935 may be stored in a non-transitory computer-readable medium such as system memory or another type of memory. In some cases, the code 935 may not be directly executable by the processor 940 but may cause a computer (e.g., when compiled and executed) to perform functions described herein. In some cases, the memory 930 may contain, among other things, a basic I/O system (BIOS) which may control basic hardware or software operation such as the interaction with peripheral components or devices.

The processor 940 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 940 may be configured to operate a memory array using a memory controller. In some other cases, a memory controller may be integrated into the processor 940. The processor 940 may be configured to execute computer-readable instructions stored in a memory (e.g., the memory 930) to cause the device 905 to perform various functions (e.g., functions or tasks supporting a multiple incremental redundancy scheme using linear rateless codes). For example, the device 905 or a component of the device 905 may include a processor 940 and memory 930 coupled with or to the processor 940, the processor 940 and memory 930 configured to perform various functions described herein.

The communications manager 920 may support wireless communication in accordance with examples as disclosed herein. For example, the communications manager 920 may be configured as or otherwise support a means for receiving a first message including a block, the block including a set of multiple sub-blocks. The communications manager 920 may be configured as or otherwise support a means for determining respective probabilities of successful decoding of respective selected candidate codewords for the set of multiple sub-blocks of the block based on receiving the first message. The communications manager 920 may be configured as or otherwise support a means for transmitting one or more indicators associated with one or more sub-blocks of the block based on the respective probabilities of successful decoding of the respective selected candidate codewords. The communications manager 920 may be configured as or otherwise support a means for receiving a second message including redundancy information for the one or more sub-blocks based on transmitting the one or more indicators associated with the one or more sub-blocks.

Additionally, or alternatively, the communications manager 920 may support wireless communication in accordance with examples as disclosed herein. For example, the communications manager 920 may be configured as or otherwise support a means for combining, for each of a set of multiple sub-blocks of a block of data, a set of unencoded bits associated with a respective sub-block with a matrix to generate a set of encoded bits, where the matrix includes a first set of columns associated with an identity matrix and a second set of columns associated with a parity matrix, where the second set of columns are arranged in an order, and where each column of the second set of columns maximizes hamming distance over each previous column in the order. The communications manager 920 may be configured as or otherwise support a means for transmitting a first message including the block. The communications manager 920 may be configured as or otherwise support a means for receiving one or more indicators associated with one or more sub-blocks of the block. The communications manager 920 may be configured as or otherwise support a means for transmitting a second message including redundancy information for the one or more sub-blocks based on receiving the one or more indicators associated with the one or more sub-blocks.

By including or configuring the communications manager 920 in accordance with examples as described herein, the device 905 may support techniques for the device 905 to increase the likelihood that the device 905 or another device successfully decodes the one or more sub-blocks while also limiting overhead.

In some examples, the communications manager 920 may be configured to perform various operations (e.g., receiving, monitoring, transmitting) using or otherwise in cooperation with the transceiver 915, the one or more antennas 925, or any combination thereof. Although the communications manager 920 is illustrated as a separate component, in some examples, one or more functions described with reference to the communications manager 920 may be supported by or performed by the processor 940, the memory 930, the code 935, or any combination thereof. For example, the code 935 may include instructions executable by the processor 940 to cause the device 905 to perform various aspects of a multiple incremental redundancy scheme using linear rateless codes as described herein, or the processor 940 and the memory 930 may be otherwise configured to perform or support such operations.

Figure 10:
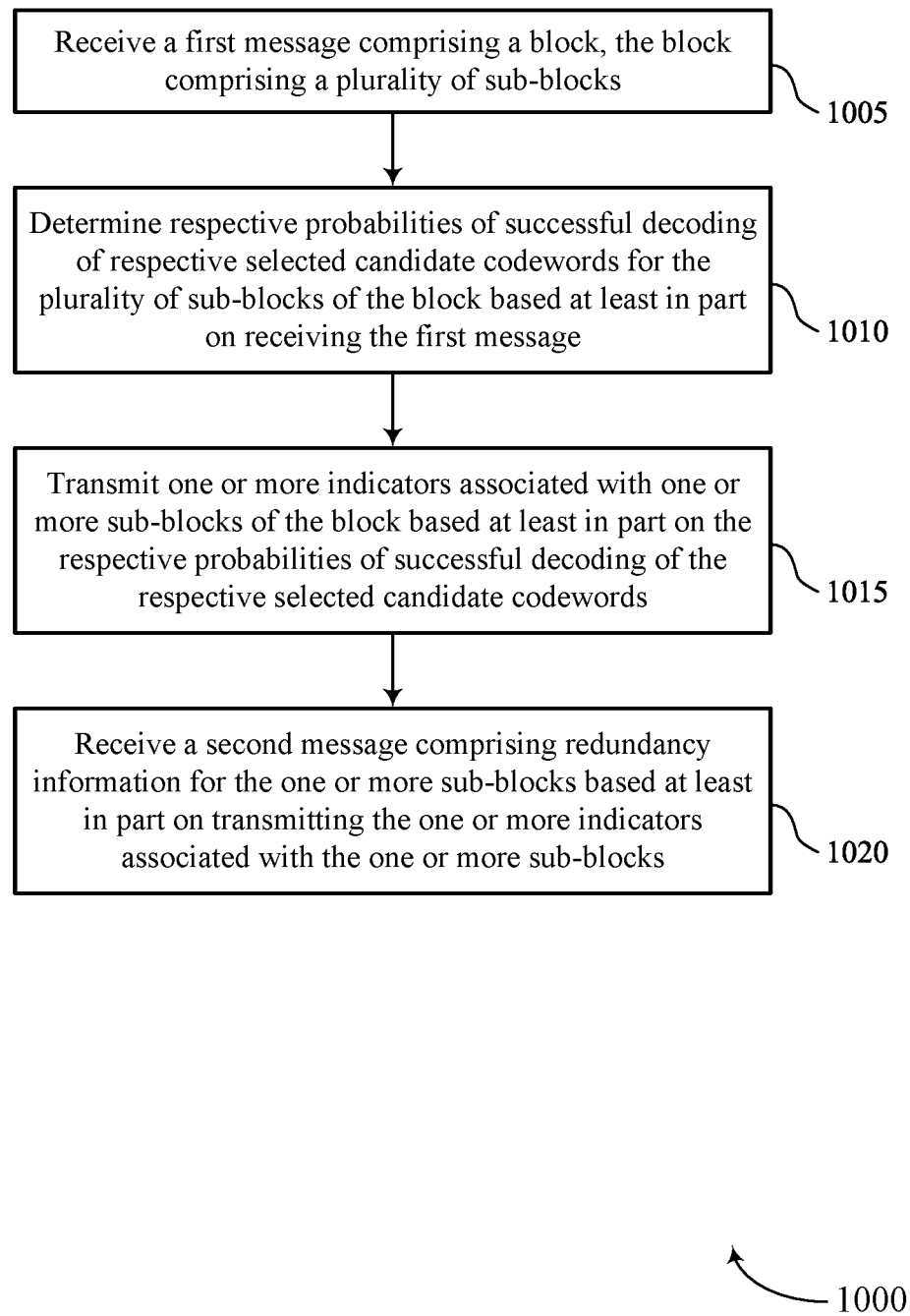
FIGS. 10 through 13 show flowcharts illustrating methods that support a multiple incremental redundancy scheme using linear rateless codes in accordance with one or more aspects of the present disclosure.

FIG. 10 shows a flowchart illustrating a method 1000 that supports a multiple incremental redundancy scheme using linear rateless codes in accordance with one or more aspects of the present disclosure. The operations of the method 1000 may be implemented by a UE or its components as described herein. For example, the operations of the method 1000 may be performed by a UE 115 as described with reference to FIGS. 1 through 9. In some examples, a UE may execute a set of instructions to control the functional elements of the UE to perform the described functions. Additionally, or alternatively, the UE may perform aspects of the described functions using special-purpose hardware.

At 1005, the method may include receiving a first message including a block, the block including a set of multiple sub-blocks. The operations of 1005 may be performed in accordance with examples as disclosed herein. In some examples, aspects of the operations of 1005 may be performed by a message communication component 825 as described with reference to FIG. 8.

At 1010, the method may include determine respective probabilities of successful decoding of respective selected candidate codewords for the set of multiple sub-blocks of the block based on receiving the first message. The operations of 1010 may be performed in accordance with examples as disclosed herein. In some examples, aspects of the operations of 1010 may be performed by a probability determination component 830 as described with reference to FIG. 8.

At 1015, the method may include transmitting one or more indicators associated with one or more sub-blocks of the block based on the respective probabilities of successful decoding of the respective selected candidate codewords. The operations of 1015 may be performed in accordance with examples as disclosed herein. In some examples, aspects of the operations of 1015 may be performed by a sub-block indicator communication component 835 as described with reference to FIG. 8.

At 1020, the method may include receiving a second message including redundancy information for the one or more sub-blocks based on transmitting the one or more indicators associated with the one or more sub-blocks. The operations of 1020 may be performed in accordance with examples as disclosed herein. In some examples, aspects of the operations of 1020 may be performed by a message communication component 825 as described with reference to FIG. 8.

Figure 11:
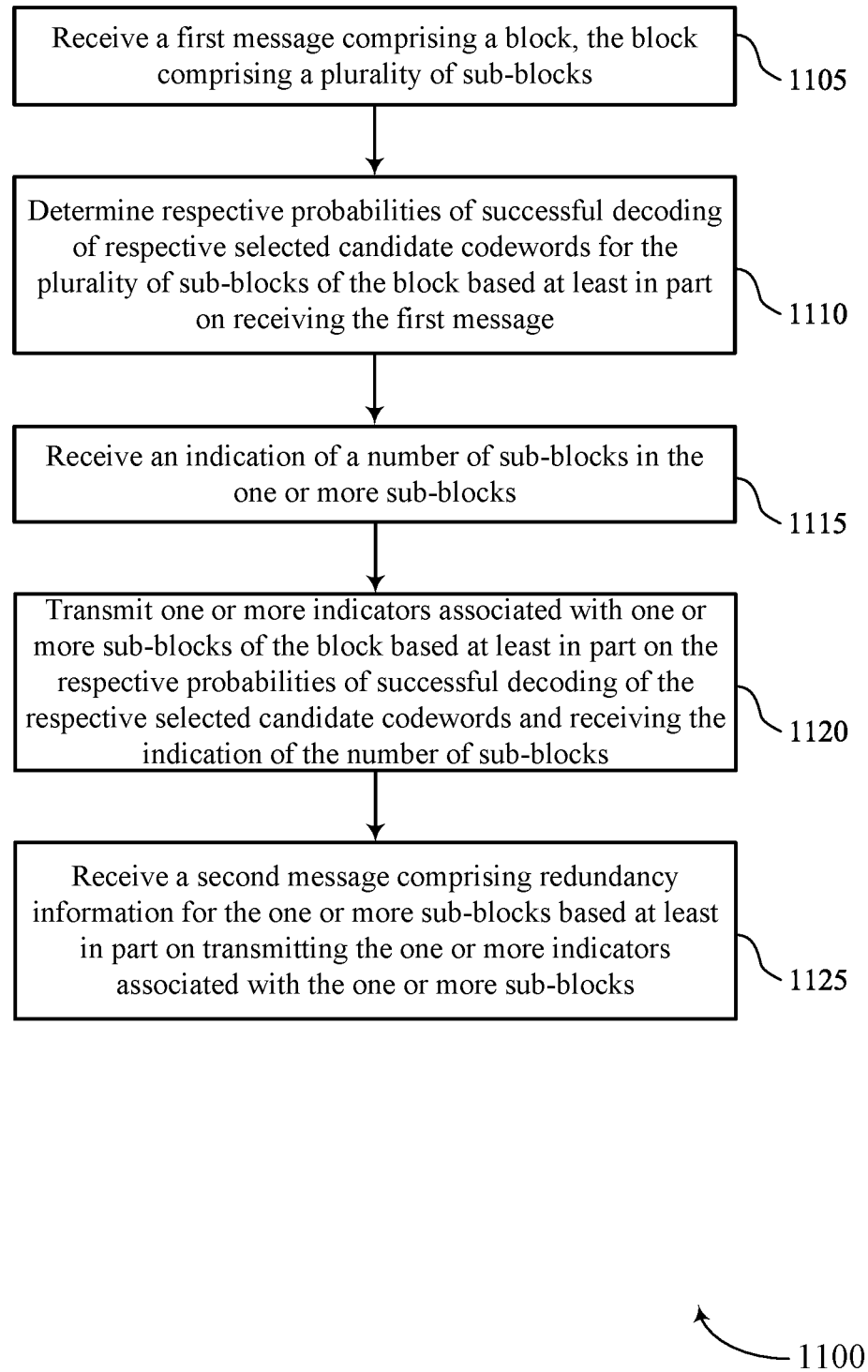

FIG. 11 shows a flowchart illustrating a method 1100 that supports a multiple incremental redundancy scheme using linear rateless codes in accordance with one or more aspects of the present disclosure. The operations of the method 1100 may be implemented by a UE or its components as described herein. For example, the operations of the method 1100 may be performed by a UE 115 as described with reference to FIGS. 1 through 9. In some examples, a UE may execute a set of instructions to control the functional elements of the UE to perform the described functions. Additionally, or alternatively, the UE may perform aspects of the described functions using special-purpose hardware.

At 1105, the method may include receiving a first message including a block, the block including a set of multiple sub-blocks. The operations of 1105 may be performed in accordance with examples as disclosed herein. In some examples, aspects of the operations of 1105 may be performed by a message communication component 825 as described with reference to FIG. 8.

At 1110, the method may include determine respective probabilities of successful decoding of respective selected candidate codewords for the set of multiple sub-blocks of the block based on receiving the first message. The operations of 1110 may be performed in accordance with examples as disclosed herein. In some examples, aspects of the operations of 1110 may be performed by a probability determination component 830 as described with reference to FIG. 8.

At 1115, the method may include receiving an indication of a number of sub-blocks in the one or more sub-blocks. The operations of 1115 may be performed in accordance with examples as disclosed herein. In some examples, aspects of the operations of 1115 may be performed by a sub-block number communication component 845 as described with reference to FIG. 8.

At 1120, the method may include transmitting one or more indicators associated with one or more sub-blocks of the block based on the respective probabilities of successful decoding of the respective selected candidate codewords and receiving the indication of the number of sub-blocks. The operations of 1120 may be performed in accordance with examples as disclosed herein. In some examples, aspects of the operations of 1120 may be performed by a sub-block indicator communication component 835 as described with reference to FIG. 8.

At 1125, the method may include receiving a second message including redundancy information for the one or more sub-blocks based on transmitting the one or more indicators associated with the one or more sub-blocks. The operations of 1125 may be performed in accordance with examples as disclosed herein. In some examples, aspects of the operations of 1125 may be performed by a message communication component 825 as described with reference to FIG. 8.

Figure 12:
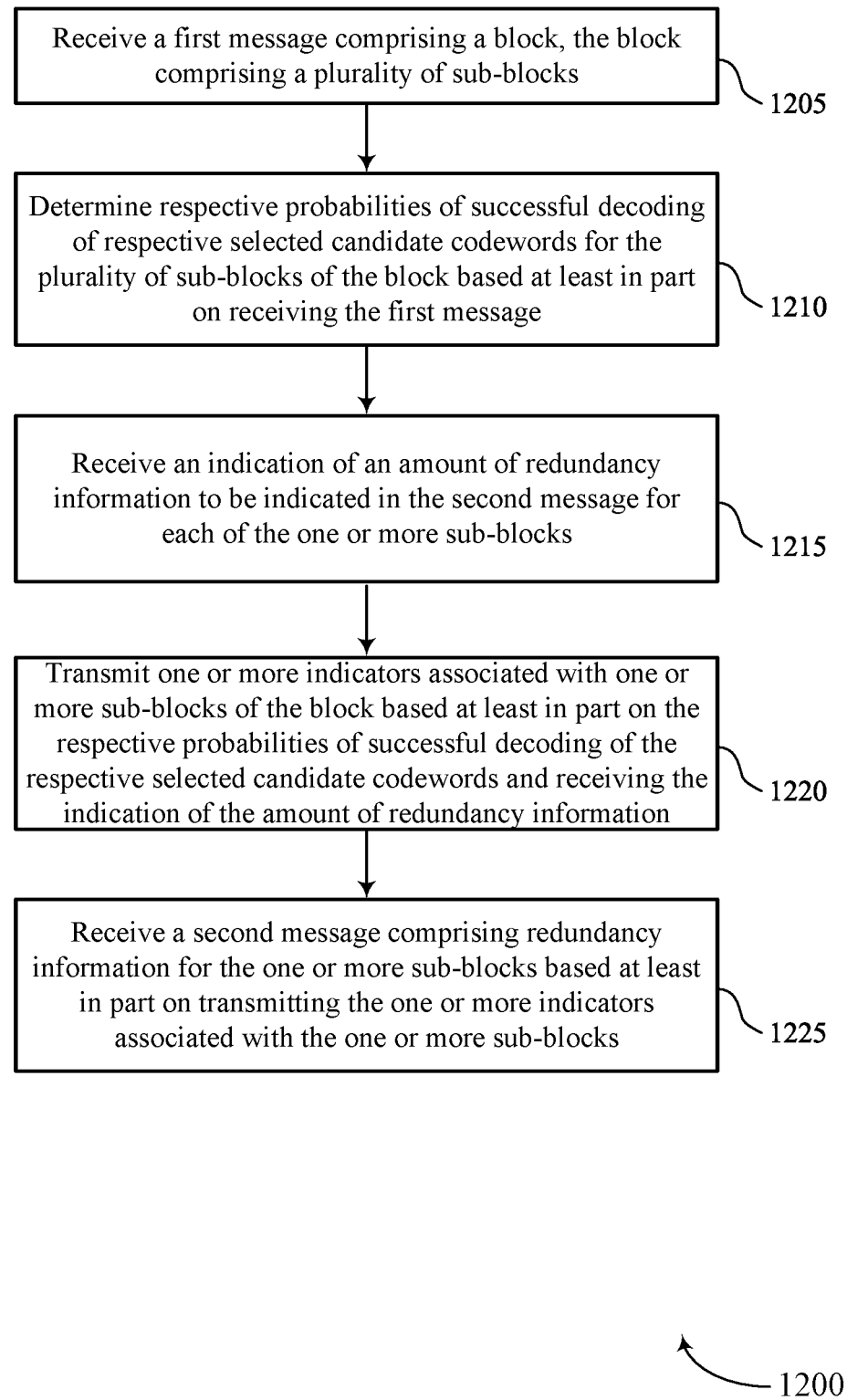

FIG. 12 shows a flowchart illustrating a method 1200 that supports a multiple incremental redundancy scheme using linear rateless codes in accordance with one or more aspects of the present disclosure. The operations of the method 1200 may be implemented by a UE or its components as described herein. For example, the operations of the method 1200 may be performed by a UE 115 as described with reference to FIGS. 1 through 9. In some examples, a UE may execute a set of instructions to control the functional elements of the UE to perform the described functions. Additionally, or alternatively, the UE may perform aspects of the described functions using special-purpose hardware.

At 1205, the method may include receiving a first message including a block, the block including a set of multiple sub-blocks. The operations of 1205 may be performed in accordance with examples as disclosed herein. In some examples, aspects of the operations of 1205 may be performed by a message communication component 825 as described with reference to FIG. 8.

At 1210, the method may include determine respective probabilities of successful decoding of respective selected candidate codewords for the set of multiple sub-blocks of the block based on receiving the first message. The operations of 1210 may be performed in accordance with examples as disclosed herein. In some examples, aspects of the operations of 1210 may be performed by a probability determination component 830 as described with reference to FIG. 8.

At 1215, the method may include receiving an indication of an amount of redundancy information to be indicated in the second message for each of the one or more sub-blocks. The operations of 1215 may be performed in accordance with examples as disclosed herein. In some examples, aspects of the operations of 1215 may be performed by a redundancy information amount receiver 850 as described with reference to FIG. 8.

At 1220, the method may include transmitting one or more indicators associated with one or more sub-blocks of the block based on the respective probabilities of successful decoding of the respective selected candidate codewords and receiving the indication of the amount of redundancy information. The operations of 1220 may be performed in accordance with examples as disclosed herein. In some examples, aspects of the operations of 1220 may be performed by a sub-block indicator communication component 835 as described with reference to FIG. 8.

At 1225, the method may include receiving a second message including redundancy information for the one or more sub-blocks based on transmitting the one or more indicators associated with the one or more sub-blocks. The operations of 1225 may be performed in accordance with examples as disclosed herein. In some examples, aspects of the operations of 1225 may be performed by a message communication component 825 as described with reference to FIG. 8.

Figure 13:
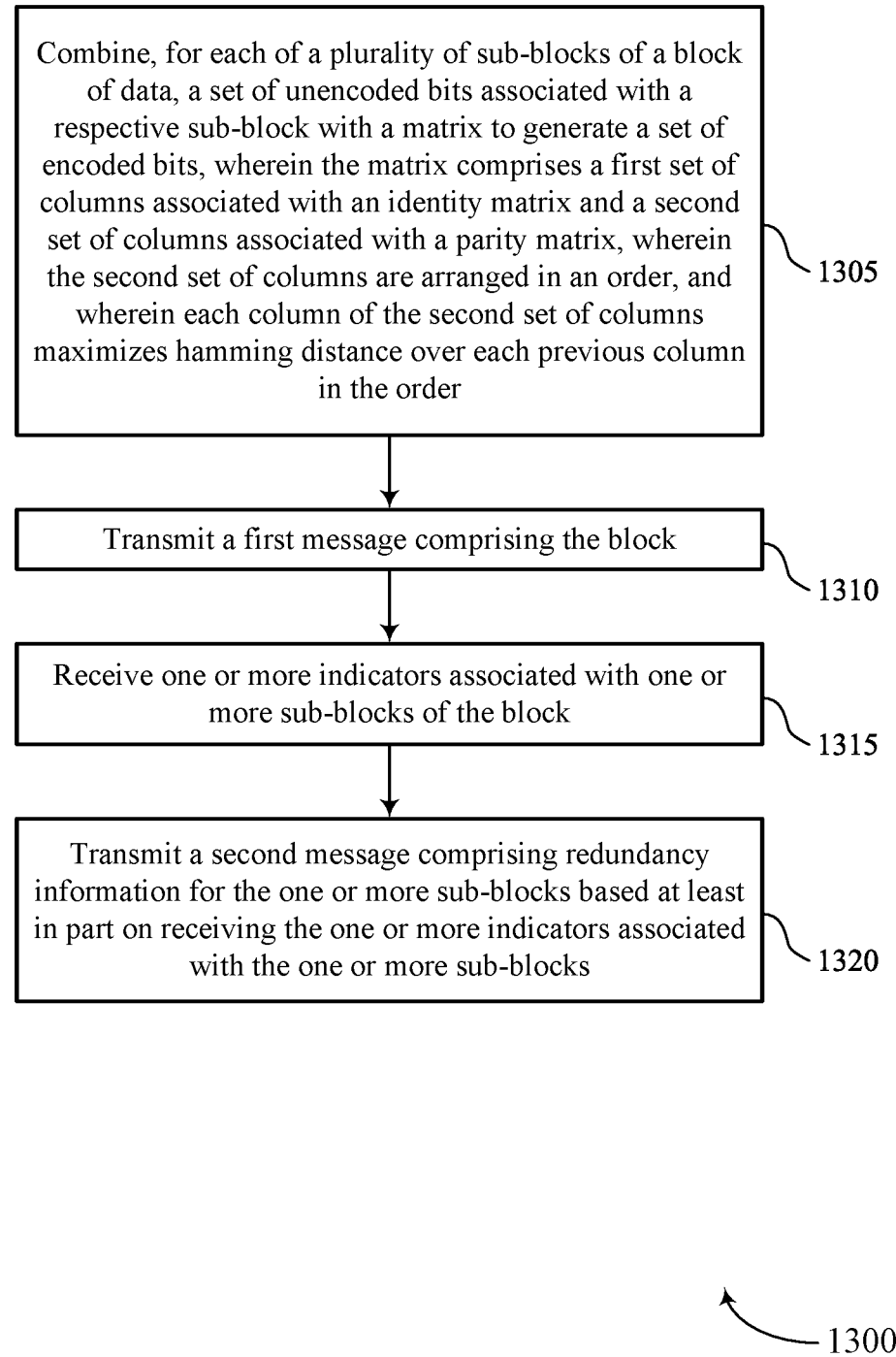

FIG. 13 shows a flowchart illustrating a method 1300 that supports a multiple incremental redundancy scheme using linear rateless codes in accordance with one or more aspects of the present disclosure. The operations of the method 1300 may be implemented by a UE or its components as described herein. For example, the operations of the method 1300 may be performed by a UE 115 as described with reference to FIGS. 1 through 9. In some examples, a UE may execute a set of instructions to control the functional elements of the UE to perform the described functions. Additionally, or alternatively, the UE may perform aspects of the described functions using special-purpose hardware.

At 1305, the method may include combining, for each of a set of multiple sub-blocks of a block of data, a set of unencoded bits associated with a respective sub-block with a matrix to generate a set of encoded bits, where the matrix includes a first set of columns associated with an identity matrix and a second set of columns associated with a parity matrix, where the second set of columns are arranged in an order, and where each column of the second set of columns maximizes hamming distance over each previous column in the order. The operations of 1305 may be performed in accordance with examples as disclosed herein. In some examples, aspects of the operations of 1305 may be performed by an encoding component 840 as described with reference to FIG. 8.

At 1310, the method may include transmitting a first message including the block. The operations of 1310 may be performed in accordance with examples as disclosed herein. In some examples, aspects of the operations of 1310 may be performed by a message communication component 825 as described with reference to FIG. 8.

At 1315, the method may include receiving one or more indicators associated with one or more sub-blocks of the block. The operations of 1315 may be performed in accordance with examples as disclosed herein. In some examples, aspects of the operations of 1315 may be performed by a sub-block indicator communication component 835 as described with reference to FIG. 8.

At 1320, the method may include transmitting a second message including redundancy information for the one or more sub-blocks based on receiving the one or more indicators associated with the one or more sub-blocks. The operations of 1320 may be performed in accordance with examples as disclosed herein. In some examples, aspects of the operations of 1320 may be performed by a message communication component 825 as described with reference to FIG. 8.

The following provides an overview of aspects of the present disclosure:

Aspect 1: A method for wireless communication, comprising: receiving a first message comprising a block, the block comprising a plurality of sub-blocks; determine respective probabilities of successful decoding of respective selected candidate codewords for the plurality of sub-blocks of the block based at least in part on receiving the first message; transmitting one or more indicators associated with one or more sub-blocks of the block based at least in part on the respective probabilities of successful decoding of the respective selected candidate codewords; and receiving a second message comprising redundancy information for the one or more sub-blocks based at least in part on transmitting the one or more indicators associated with the one or more sub-blocks.

Aspect 2: The method of aspect 1, further comprising: receiving an indication of a number of sub-blocks in the one or more sub-blocks, wherein transmitting the one or more indicators associated with the one or more sub-blocks is based at least in part on the indication of the number of sub-blocks.

Aspect 3: The method of any of aspects 1 through 2, further comprising: receiving an indication of an amount of redundancy information to be indicated in the second message for each of the one or more sub-blocks, wherein transmitting the one or more indicators associated with the one or more sub-blocks of the plurality of sub-blocks is based at least in part on receiving the indication of the amount of redundancy information.

Aspect 4: The method of any of aspects 1 through 3, further comprising: determining, for each sub-block of the plurality of sub-blocks and for each candidate codeword of a set of candidate codewords, a correlation of the respective candidate codeword against a logarithmic likelihood ratio associated with the respective sub-block; and selecting the respective selected candidate codewords for the plurality of sub-blocks based at least in part on determining the correlation for each sub-block of the plurality of sub-blocks and for each candidate codeword of the set of candidate codewords.

Aspect 5: The method of aspect 4, wherein the respective set of candidate codewords for each sub-block of the plurality of sub-blocks comprises each possible candidate codeword that has a length equal to that of the respective sub-block.

Aspect 6: The method of any of aspects 4 through 5, wherein. the respective probability of successful decoding for each respective selected candidate codeword comprises a ratio of the correlation for the respective selected candidate codeword to a sum of correlations among one or more candidate codewords of the respective set of candidate codewords associated with the sub-block that the respective selected candidate codeword corresponds to, and the correlation of the respective selected candidate codeword has a highest value among the respective set of candidate codewords associated with the sub-block that the respective selected candidate codeword corresponds to Aspect 7: The method of any of aspects 1 through 6, further comprising: decoding a set of predecoded codewords to generate the respective selected candidate codewords, wherein determining the respective probabilities of successful decoding of respective selected candidate codewords is based at least in part on a first set of logarithmic likelihood ratios of bits associated with the respective selected candidate codewords or a second set of logarithmic likelihood ratios of bits associated with the set of predecoded codewords.

Aspect 8: The method of any of aspects 1 through 7, wherein the redundancy information comprises a respective set of parity bits for each of the one or more sub-blocks.

Aspect 9: The method of aspect 8, wherein a total number of parity bits associated with a first sub-block of the one or more sub-blocks after receiving the second message is greater than a total number of parity bits associated with a second sub-block of the plurality of sub-blocks that is excluded from the one or more sub-blocks.

Aspect 10: The method of any of aspects 8 through 9, wherein a total number of parity bits associated with the first sub-block of the one or more sub-blocks after receiving the second message is greater than a total number of parity bits associated with a second sub-block of the one or more sub-blocks.

Aspect 11: The method of any of aspects 8 through 10, wherein the respective set of parity bits for each of the one or more sub-blocks are associated with a same number of parity bits.

Aspect 12: The method of any of aspects 1 through 11, wherein. the first message comprises a check code corresponding to the block, and determining the respective probabilities of successful decoding of the respective selected candidate codewords is based at least in part on determining a failure of a comparison of the check code for the block with a check value generated from the respective selected candidate codewords Aspect 13: The method of any of aspects 1 through 12, wherein. the first message comprises a set of check codes, each check code of the set of check codes corresponds to a respective sub-block of the plurality of sub-blocks Aspect 14: The method of aspect 13, wherein determining the respective probabilities of successful decoding of the respective selected candidate codewords is based at least in part on determining a failure of one or more check codes of the set of check codes with a check value generated from one or more of the respective selected candidate codewords.

Aspect 15: A method for wireless communication, comprising: combining, for each of a plurality of sub-blocks of a block of data, a set of unencoded bits associated with a respective sub-block with a matrix to generate a set of encoded bits, wherein the matrix comprises a first set of columns associated with an identity matrix and a second set of columns associated with a parity matrix, wherein the second set of columns are arranged in an order, and wherein each column of the second set of columns maximizes hamming distance over each previous column in the order; transmitting a first message comprising the block; receiving one or more indicators associated with one or more sub-blocks of the block; and transmitting a second message comprising redundancy information for the one or more sub-blocks based at least in part on receiving the one or more indicators associated with the one or more sub-blocks.

Aspect 16: The method of aspect 15, further comprising: transmitting an indication of a number of sub-blocks in the one or more sub-blocks, wherein receiving the one or more indicators associated with the one or more sub-blocks is based at least in part on the indication of the number of sub-blocks.

Aspect 17: The method of any of aspects 15 through 16, further comprising: transmitting an indication of an amount of redundancy information to be indicated in the second message for each of the one or more sub-blocks, wherein receiving the one or more indicators associated with the one or more sub-blocks of the plurality of sub-blocks is based at least in part on transmitting the indication of the amount of redundancy information.

Aspect 18: The method of any of aspects 15 through 17, further comprising: puncturing an ordered list of symbols, wherein the puncturing comprises: identifying a next symbol for transmission on the ordered list; replacing the next symbol with another symbol on the ordered list based at least in part on receiving the one or more indicators associated with the one or more sub-blocks of the block; and transmitting the other symbol based at least in part on the replacing.

Aspect 19: The method of any of aspects 15 through 18, wherein the order for the second set of columns corresponds to a second order that is rearranged from a first order of a linear block code.

Aspect 20: The method of any of aspects 15 through 19, wherein the redundancy information comprises a respective set of parity bits for each of the one or more sub-blocks.

Aspect 21: The method of any of aspects 15 through 20, wherein the first message comprises a check code for the block.

Aspect 22: An apparatus for wireless communication, comprising a processor; memory coupled with the processor; and instructions stored in the memory and executable by the processor to cause the apparatus to perform a method of any of aspects 1 through 14.

Aspect 23: An apparatus for wireless communication, comprising at least one means for performing a method of any of aspects 1 through 14.

Aspect 24: A non-transitory computer-readable medium storing code for wireless communication, the code comprising instructions executable by a processor to perform a method of any of aspects 1 through 14.

Aspect 25: An apparatus for wireless communication, comprising a processor; memory coupled with the processor; and instructions stored in the memory and executable by the processor to cause the apparatus to perform a method of any of aspects 15 through 21.

Aspect 26: An apparatus for wireless communication, comprising at least one means for performing a method of any of aspects 15 through 21.

Aspect 27: A non-transitory computer-readable medium storing code for wireless communication, the code comprising instructions executable by a processor to perform a method of any of aspects 15 through 21.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

The term "determine" or "determining" encompasses a variety of actions and, therefore, "determining" can include calculating, computing, processing, deriving, investigating, looking up (such as via looking up in a table, a database or another data structure), ascertaining and the like. Also, "determining" can include receiving (such as receiving information), accessing (such as accessing data in a memory) and the like. Also, "determining" can include resolving, obtaining, selecting, choosing, establishing and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method for wireless communication, comprising:
   combining, for each sub-block of a plurality of sub-blocks of a first block of data, a set of unencoded bits associated with a respective sub-block with a matrix to generate a set of encoded bits, wherein the matrix comprises a first set of columns associated with an identity matrix and a second set of columns associated with a parity matrix, wherein the second set of columns are arranged in an order, and wherein each column of the second set of columns maximizes hamming distance over each previous column in the order;
   transmitting a first message comprising a second block of data, the second block of data comprising at least a respective portion of encoded bits of the set of encoded bits for each sub-block of the plurality of sub-blocks;
   receiving one or more indicators associated with one or more sub-blocks of the second block; and
   transmitting a second message comprising redundancy information for the one or more sub-blocks based at least in part on receiving the one or more indicators associated with the one or more sub-blocks.

2. The method of claim 1, further comprising:
   transmitting an indication of a number of sub-blocks in the one or more sub-blocks, wherein receiving the one or more indicators associated with the one or more sub-blocks is based at least in part on the indication of the number of sub-blocks.

3. The method of claim 1, further comprising:
   transmitting an indication of an amount of the redundancy information to be indicated in the second message for each sub-block of the one or more sub-blocks, wherein receiving the one or more indicators associated with the one or more sub-blocks of the plurality of sub-blocks is based at least in part on transmitting the indication of the amount of the redundancy information.

4. The method of claim 1, wherein the respective portion of encoded bits for each sub-block in the plurality of sub-blocks are transmitted in accordance with an ordered list of symbols, further comprising:
   puncturing the ordered list of symbols for transmission of the second message, wherein the puncturing comprises:
      identifying a next symbol for transmission on the ordered list of symbols;

replacing the next symbol with another symbol on the ordered list of symbols based at least in part on receiving the one or more indicators associated with the one or more sub-blocks of the second block; and transmitting the other symbol based at least in part on the replacing.

5. The method of claim 1, wherein the order for the second set of columns corresponds to a second order that is rearranged from a first order of a linear block code.

6. The method of claim 1, wherein the redundancy information comprises a respective set of parity bits for each sub-block of the one or more sub-blocks.

7. The method of claim 1, wherein the first message comprises a check code for the first block.

8. The method of claim 1, wherein:
the first message comprises a set of check codes; and
each check code of the set of check codes corresponds to a respective sub-block of the plurality of sub-blocks.

9. An apparatus for wireless communication, comprising:
one or more processors;
memory coupled with the one or more processors; and
instructions stored in the memory and executable by the one or more processors to cause the apparatus to:
combine, for each sub-block of a plurality of sub-blocks of a first block of data, a set of unencoded bits associated with a respective sub-block with a matrix to generate a set of encoded bits, wherein the matrix comprises a first set of columns associated with an identity matrix and a second set of columns associated with a parity matrix, wherein the second set of columns are arranged in an order, and wherein each column of the second set of columns maximizes hamming distance over each previous column in the order;
transmit a first message that comprises a second block of data, wherein the second block of data comprises at least a respective portion of encoded bits of the set of encoded bits for each sub-block of the plurality of sub-blocks;
receive one or more indicators associated with one or more sub-blocks of the second block; and
transmit a second message that comprises redundancy information for the one or more sub-blocks based at least in part on reception the one or more indicators associated with the one or more sub-blocks.

10. The apparatus of claim 9, wherein the instructions are further executable by the one or more processors to cause the apparatus to:
transmit an indication of a number of sub-blocks in the one or more sub-blocks,
wherein the one or more indicators associated with the one or more sub-blocks are received based at least in part on the indication of the number of sub-blocks.

11. The apparatus of claim 9, wherein the instructions are further executable by the one or more processors to cause the apparatus to:
transmit an indication of an amount of the redundancy information to be indicated in the second message for each sub-block of the one or more sub-blocks, wherein the one or more indicators associated with the one or more sub-blocks of the plurality of sub-blocks are received based at least in part on transmission of the indication of the amount of the redundancy information.

12. The apparatus of claim 9, wherein the respective portions of encoded bits for each sub-block in the plurality of sub-blocks are transmitted in accordance with an ordered list of symbols, wherein the instructions are further executable by the one or more processors to cause the apparatus to:
puncture the ordered list of symbols for transmission of the second message, wherein, to puncture the ordered list of symbols, the instructions are further executable by the one or more processors to cause the apparatus to:
identify a next symbol for transmission on the ordered list of symbols;
replace the next symbol with another symbol on the ordered list of symbols based at least in part on reception of the one or more indicators associated with the one or more sub-blocks of the second block; and
transmit the other symbol based at least in part on the replacement.

13. The apparatus of claim 9, wherein the order for the second set of columns corresponds to a second order that is rearranged from a first order of a linear block code.

14. The apparatus of claim 9, wherein the redundancy information comprises a respective set of parity bits for each sub-block of the one or more sub-blocks.

15. The apparatus of claim 9, wherein the first message comprises a check code for the first block.

16. The apparatus of claim 9, wherein:
the first message comprises a set of check codes; and
each check code of the set of check codes corresponds to a respective sub-block of the plurality of sub-blocks.

17. An apparatus for wireless communication, comprising:
means for combining, for each sub-block of a plurality of sub-blocks of a first block of data, a set of unencoded bits associated with a respective sub-block with a matrix to generate a set of encoded bits, wherein the matrix comprises a first set of columns associated with an identity matrix and a second set of columns associated with a parity matrix, wherein the second set of columns are arranged in an order, and wherein each column of the second set of columns maximizes hamming distance over each previous column in the order;
means for transmitting a first message comprising a second block of data, the second block of data comprising at least a respective portion of encoded bits of the set of encoded bits for each sub-block of the plurality of sub-blocks;
means for receiving one or more indicators associated with one or more sub-blocks of the second block; and
means for transmitting a second message comprising redundancy information for the one or more sub-blocks based at least in part on receiving the one or more indicators associated with the one or more sub-blocks.

18. The apparatus of claim 17, further comprising:
means for transmitting an indication of a number of sub-blocks in the one or more sub-blocks, wherein receiving the one or more indicators associated with the one or more sub-blocks is based at least in part on the indication of the number of sub-blocks.

19. The apparatus of claim 17, further comprising:
means for transmitting an indication of an amount of the redundancy information to be indicated in the second message for each sub-block of the one or more sub-blocks, wherein receiving the one or more indicators associated with the one or more sub-blocks of the plurality of sub-blocks is based at least in part on transmitting the indication of the amount of the redundancy information.

20. The apparatus of claim 17, wherein the respective portions of encoded bits for each sub-block in the plurality of sub-blocks are transmitted in accordance with an ordered list of symbols, further comprising:
- means for puncturing the ordered list of symbols for transmission of the second message, wherein the puncturing comprises:
  - means for identifying a next symbol for transmission on the ordered list of symbols;
  - means for replacing the next symbol with another symbol on the ordered list of symbols based at least in part on receiving the one or more indicators associated with the one or more sub-blocks of the second block; and
  - means for transmitting the other symbol based at least in part on the replacing.

21. The apparatus of claim 17, wherein the order for the second set of columns corresponds to a second order that is rearranged from a first order of a linear block code.

22. The apparatus of claim 17, wherein the redundancy information comprises a respective set of parity bits for each sub-block of the one or more sub-blocks.

23. The apparatus of claim 17, wherein the first message comprises a check code for the first block.

24. A non-transitory computer-readable medium storing code for wireless communication, the code comprising instructions executable by one or more processors to:
- combine, for each sub-block of a plurality of sub-blocks of a first block of data, a set of unencoded bits associated with a respective sub-block with a matrix to generate a set of encoded bits, wherein the matrix comprises a first set of columns associated with an identity matrix and a second set of columns associated with a parity matrix, wherein the second set of columns are arranged in an order, and wherein each column of the second set of columns maximizes hamming distance over each previous column in the order;
- transmit a first message comprising a second block of data, the second block of data comprising at least a respective portion of encoded bits of the set of encoded bits for each sub-block of the plurality of sub-blocks;
- receive one or more indicators associated with one or more sub-blocks of the second block; and
- transmit a second message comprising redundancy information for the one or more sub-blocks based at least in part on receiving the one or more indicators associated with the one or more sub-blocks.

25. The non-transitory computer-readable medium of claim 24, wherein the instructions are further executable by the one or more processors to:
- transmit an indication of a number of sub-blocks in the one or more sub-blocks,
- wherein receiving the one or more indicators associated with the one or more sub-blocks is based at least in part on the indication of the number of sub-blocks.

26. The non-transitory computer-readable medium of claim 24, wherein the instructions are further executable by the one or more processors to:
- transmit an indication of an amount of the redundancy information to be indicated in the second message for each sub-block of the one or more sub-blocks, wherein receiving the one or more indicators associated with the one or more sub-blocks of the plurality of sub-blocks is based at least in part on transmitting the indication of the amount of the redundancy information.

27. The non-transitory computer-readable medium of claim 24, wherein the respective portions of encoded bits for each sub-block in the plurality of sub-blocks are transmitted in accordance with an ordered list of symbols, wherein the instructions are further executable by the one or more processors to:
- puncture the ordered list of symbols for transmission of the second message, wherein the puncturing comprises:
  - identify a next symbol for transmission on the ordered list of symbols;
  - replace the next symbol with another symbol on the ordered list of symbols based at least in part on receiving the one or more indicators associated with the one or more sub-blocks of the second block; and
  - transmit the other symbol based at least in part on the replacing.

28. The non-transitory computer-readable medium of claim 24, wherein the order for the second set of columns corresponds to a second order that is rearranged from a first order of a linear block code.

29. The non-transitory computer-readable medium of claim 24, wherein the redundancy information comprises a respective set of parity bits for each sub-block of the one or more sub-blocks.

30. The non-transitory computer-readable medium of claim 24, wherein the first message comprises a check code for the first block.

* * * * *